(12) United States Patent
Kaito

(10) Patent No.: US 9,074,299 B2
(45) Date of Patent: Jul. 7, 2015

(54) POLYCRYSTALLINE SILICON ROD

(71) Applicant: MITSUBISHI MATERIALS CORPORATION, Tokyo (JP)

(72) Inventor: Ryoichi Kaito, Yokkaichi (JP)

(73) Assignee: MITSUBISHI MATERIALS CORPORATION, Tokyo (JP)

( * ) Notice: Subject to any disclaimer, the term of this patent is extended or adjusted under 35 U.S.C. 154(b) by 228 days.

(21) Appl. No.: 13/924,932

(22) Filed: Jun. 24, 2013

(65) Prior Publication Data

US 2014/0004377 A1     Jan. 2, 2014

(30) Foreign Application Priority Data

Jun. 29, 2012   (JP) ................ 2012-146338

(51) Int. Cl.
  *C01B 33/02*   (2006.01)
  *B32B 27/32*   (2006.01)
  *G11B 11/105*  (2006.01)
  *C30B 29/62*   (2006.01)
  *C30B 29/06*   (2006.01)
  *C01B 33/035*  (2006.01)

(52) U.S. Cl.
  CPC ............. *C30B 29/62* (2013.01); *C30B 29/06* (2013.01); *Y10T 428/12639* (2015.01); *C01B 33/035* (2013.01); *C01P 2002/60* (2013.01); *C01P 2004/02* (2013.01)

(58) Field of Classification Search
  CPC ...... C01B 33/02; C01B 33/035; C01B 29/06; C01B 29/62; C01B 2002/60; C01B 2004/02
  USPC ............. 423/348, 349; 428/220, 332, 544
  See application file for complete search history.

(56) References Cited

U.S. PATENT DOCUMENTS

| | | | | |
|---|---|---|---|---|
| 5,310,531 A * | 5/1994 | Ikeda et al. | ............ | 423/324 |
| 6,749,824 B2 * | 6/2004 | Keck et al. | ............ | 423/348 |
| 2003/0150378 A1 | 8/2003 | Winterton et al. | | |
| 2008/0286550 A1 | 11/2008 | Sofin et al. | | |

FOREIGN PATENT DOCUMENTS

| | | |
|---|---|---|
| DE | 2016339 A | 10/1971 |
| EP | 1992593 A2 | 11/2008 |
| EP | 1992593 A3 | 11/2008 |
| JP | 2008-285403 A | 11/2008 |

OTHER PUBLICATIONS

European Search Report dated Oct. 22, 2013, issued for the European patent application No. 13174057.3.

* cited by examiner

*Primary Examiner* — Jonathan Langman
(74) *Attorney, Agent, or Firm* — Locke Lord LLP

(57) ABSTRACT

A polycrystalline silicon rod comprises a seed rod made of polycrystalline silicon, and a polycrystalline silicon deposit which is deposited on the outer circumferential surface of the seed rod by the CVD process. A diameter of the polycrystalline silicon rod is 77 mm or less. When the polycrystalline silicon rod is observed by an optical microscope with respect to the cross section perpendicular to an axis of the seed rod, needle-shaped crystals each having a length of 288 μm or less are uniformly distributed radially with the seed rod being as the center in the polycrystalline silicon deposit. The needle-shaped crystals account for 78% or more of the cross section.

7 Claims, 18 Drawing Sheets

US 9,074,299 B2

POLYCRYSTALLINE SILICON ROD

TECHNICAL FIELD

The present invention relates to a polycrystalline silicon rod used as a raw material for manufacturing a single crystal silicon by the FZ method (Floating Zone method).

It is to be noted that this application claims the priority based on the Japanese Patent Application No. 146338 (Japanese Patent Application No. 2012-146338) filed on Jun. 29, 2012, and claims the entire content of the Japanese Patent Application No. 2012-146338 for this Application.

BACKGROUND ART

There is conventionally disclosed a polycrystalline silicon rod obtained such that gas containing silicon is thermally decomposed or is reduced by hydrogen under the condition of high temperature so that high purity silicon is deposited on a filament rod (see e.g., the Patent literature 1). This polycrystalline silicon rod includes at least four regions having different fine structures on the radial cross section of the rod. Moreover, this polycrystalline silicon rod is configured so that a polycrystalline thin rod exists within a region A of the innermost polycrystalline rod center, and no needle-shaped crystal exists or only a bit of needle-shaped crystals exists or exist within a region B of polycrystalline silicon deposited around the thin rod. More specifically, the thin rod of the region A is formed so as to have a regular square in cross section having a size of sides of 5 to 10 mm, and the diameter of the region B is formed so that it is more than 30 mm. Moreover, the area percentage of the needle-shaped crystals within the region B is less than 1%, the length of the needle-shaped crystals is 5 mm or less, and the width thereof is 1 mm or less. Moreover, the polycrystalline silicon rod is configured within the outside region D thereof so that the area percentage of the needle-shaped crystals is less than 7%, the length of the needle-shaped crystals is less than 15 mm, the width of the needle-shaped crystals is less than 2 mm, and the length of the micro-crystals of the matrix is not above 0.2 mm. Further, the polycrystalline silicon rod is configured between the regions B and D so that there exists a mixed region C such that the crystal structure smoothly shifts from the structure within the region B to the structure within the region D.

In the polycrystalline silicon rod constituted in this way, since a bit of needle-shaped crystals of a small size within the region B are completely molten by heating in the subsequent FZ method, it is possible to eliminate a deficiency such that any defect may take place within the single crystal silicon after unmolten needle-shaped crystals or the remaining parts thereof are passed through the molten zone. Moreover, within the outside region D, the highest thermal stress may take place in the polycrystalline silicon rod during deposition process. It is to be noted that the strength is enhanced by microcrystalline matrix to a degree such that any breakage or crack does not take place within the rod region and the bridge region except for the rod bottom part in contact with electrodes. Further, the mixed region C taking place between the inside region B and the outside region D has a crystal structure smoothly shifting from the structure within the region B to the structure of the region D, and this mixed region C exists within the diameter region of 30 mm to 120 mm.

CITATION LIST

Patent Literatures

Patent Literature 1: Japanese Unexamined Patent Application Publication No. 2008-285403 (Claim 1, paragraphs [0019] to [0023], FIG. 1)

DISCLOSURE OF INVENTION

Problem to be Solved by the Invention

However, in the polycrystalline silicon rod disclosed in the conventional Patent reference 1, in the case where there exist relatively longer coarse grains such that lengths of the needle-shaped crystals in this polycrystalline silicon rod are above 1 mm, since needle-shaped crystals of coarse grains are difficult to be molten when heated in the process for manufacturing single crystal silicon by the FZ method, there are instances where the polycrystalline silicon rod may not be completely molten. These silicon coarse grains in unmolten state might cause defects in the single crystal silicon, leading to a deficiency such that there results dislocation.

Accordingly, the object of the present invention is to provide a polycrystalline silicon rod such that no dislocation takes place when single-crystallization of the polycrystalline silicon rod is performed by the FZ method, and capable of stably performing control at the time of single-crystallization process.

Means for Solving Problem

The first aspect of the present invention is directed to a polycrystalline silicon rod comprising a seed rod made of polycrystalline silicon, and a polycrystalline silicon deposit which is deposited on an outer circumferential surface of the seed rod by the CVD process (Chemical Vapor Deposition process), wherein a diameter of the polycrystalline silicon rod is 77 mm or less, wherein when the polycrystalline silicon rod is observed by an optical microscope with respect to a cross section perpendicular to an axis of the seed rod, needle-shaped crystals each having a length of 288 µm or less are uniformly distributed radially with the seed rod being as the center in the polycrystalline silicon deposit and wherein the needle-shaped crystals account for 78% or more area of the cross section, that is, an occupied area percentage of needle-shaped crystals is 78% or more.

The second aspect of the present invention is directed to the invention based on the first aspect, wherein when the polycrystalline silicon rod is further observed with respect to the cross section perpendicular to the axis of the seed rod, lengths and widths of the needle-shaped crystals at a position away by 5 mm from the outer circumferential surface of the seed rod toward the outside in the radial direction thereof on the same circumference with the axis of the seed rod being as the center of the seed rod are distributed so that the lengths and the widths are respectively 115 µm or less and is 23 µm or less.

The third aspect of the present invention is directed to the invention based on the first aspect, wherein when the polycrystalline silicon rod is further observed with respect to the cross section perpendicular to the axis of the seed rod, lengths and widths of the needle-shaped crystals at a position away by 10 mm from the outer circumferential surface of the seed rod toward the outside in the radial direction thereof on the same circumference with the axis of the seed rod being as the center are distributed so that the lengths and the widths are respectively 225 µm or less and is 55 µm or less.

The fourth aspect of the present invention is directed to the invention based on the first aspect, wherein when the polycrystalline silicon rod is further observed with respect to the cross section perpendicular to the axis of the seed rod, lengths and widths of the needle-shaped crystals at a position away by 25 mm from the outer circumferential surface of the seed rod toward the outside in the radial direction thereof on the same circumference with the axis of the seed rod being as the center are distributed so that the lengths and the widths are respectively 288 μm or less and is 48 μm or less.

The fifth aspect of the present invention is directed to the invention based on the first aspect, wherein when the polycrystalline silicon rod is further observed with respect to the cross section perpendicular to the axis of the seed rod, lengths and widths of the needle-shaped crystals in the seed rod are distributed so that the lengths and the widths are respectively 135 μm or less and is 45 μm or less.

The sixth aspect of the present invention is directed to a polycrystalline silicon rod comprising a seed rod made of polycrystalline silicon, and a polycrystalline silicon deposit deposited on an outer circumferential surface of the seed rod by the CVD process, wherein a diameter of the polycrystalline silicon rod is above 77 mm, wherein when the polycrystalline silicon rod is observed by an optical microscope with respect to a cross section perpendicular to an axis of the seed rod of the polycrystalline silicon rod, needle-shaped crystals each having a length of 291 μm or less are radially and uniformly distributed with the seed rod being as the center in the polycrystalline silicon deposit, and wherein the needle-shaped crystals account for 15% to 35% of the cross section within a region having 127 mm, that is, an occupied area percentage on the cross section which falls within the range from 15% to 35% within a region having 127 mm.

The seventh aspect of the present invention is directed to the invention based on the sixth aspect, wherein the diameter of the polycrystalline silicon rod is further 153 mm or less.

Effect of the Invention

In the polycrystalline silicon rod of the first aspect of the present invention, the needle-shaped crystals in the polycrystalline silicon deposit each having a diameter of 77 mm or less are formed so that each length thereof is not above 288 μm. In addition, the occupied area percentage of the needle-shaped crystals is 78% or more. Thus, in heating and melting polycrystalline silicon rod for the purpose of single-crystallization by the FZ method, such unmolten crystals to cause defects in the single crystal silicon are difficult to be left, resulting in extremely low possibility such that dislocation may take place. Moreover, micro-crystals are formed so that each length of the needle-shaped crystals in the polycrystalline silicon deposit is not above 288 μm, thereby making it possible to suppress formation of voids taking place in the process of the crystal deposition. For this reason, it is possible to provide a uniform crystal structure.

In the polycrystalline silicon rod of the fifth aspect of the present invention, the needle-shaped crystals in the seed rod are formed so that each length thereof is not above 288 μm, whereby unmolten needle-shaped crystals are difficult to take place at the time of melting the seed rod part (including the seed rod and a part deposited from the seed rod) in the process for manufacturing single crystal silicon by the FZ method. Thus, it is possible to reduce occurrence of dislocation.

The polycrystalline silicon rod of the sixth aspect of the present invention includes a polycrystalline silicon deposit having a diameter above 77 mm, and needle-shaped crystals are formed so that each length is not above 291 μm within a region having at least a diameter of 127 mm. In addition, as the occupied area percentage of the needle-shaped crystals falls within the range from 15% to 35%, when the polycrystalline silicon rod is heated and molten for single-crystallization based on the FZ method, few unmolten needle-shaped crystals causing defect within the single crystal silicon are left. As a result, no dislocation is produced. Moreover, micro-crystals are formed so that each length of needle-shaped crystals in the polycrystalline silicon deposit is not above 291 μm, thereby making it possible to suppress formation of voids produced in the crystal depositing process. For this reason, it is possible to provide a uniform crystal structure.

EMBODIMENT(S) FOR CARRYING OUT THE INVENTION

Figure 1:
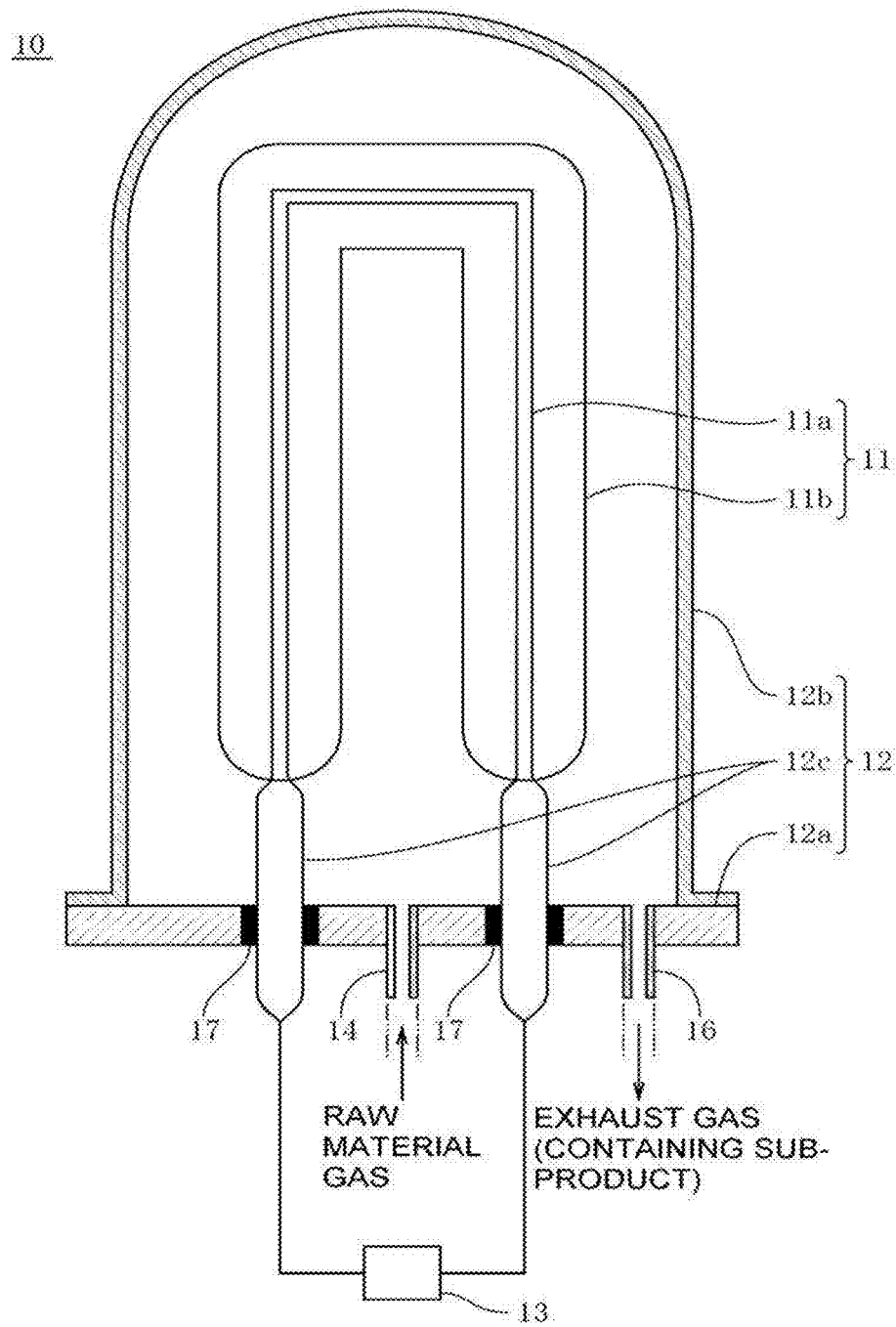
FIG. 1 is a longitudinal cross sectional view of a polycrystalline silicon depositing device for depositing polycrystalline silicon deposit onto an outer circumferential surface of a seed rod made of polycrystalline silicon according to a preferred embodiment of the present invention.
Figure 2:
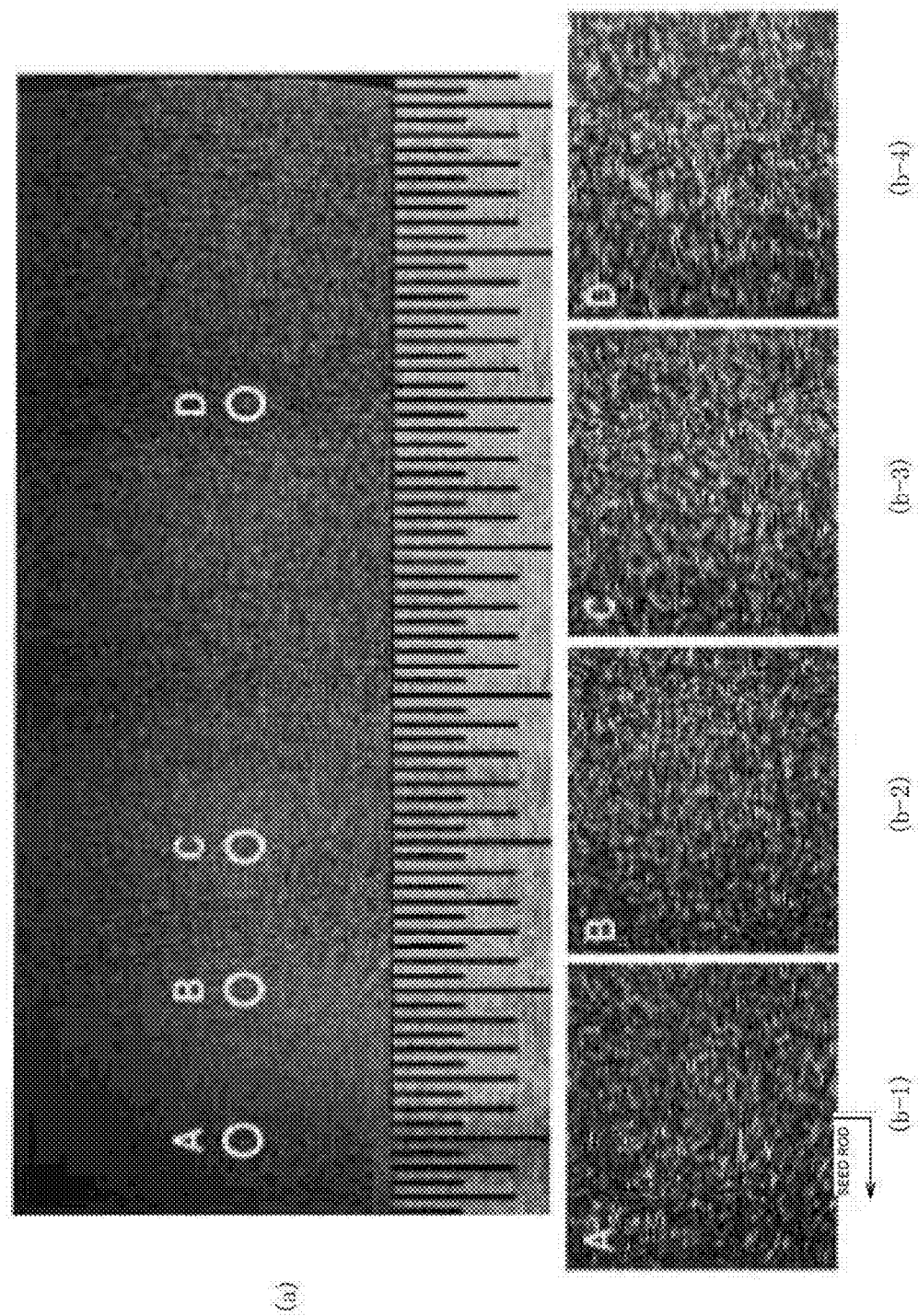
FIG. 2(a) is a photographic view when the cross section perpendicular to the axis of seed rod made of the polycrystalline silicon rod of an example 1 is observed by optical microscope, and FIG. 2(b-1) to FIG. 2(b-4) are photographic views respectively showing, in an enlarged fashion, the part A, the part B, the part C and the part D in the photographic view of FIG. 2(a)
Figure 3:
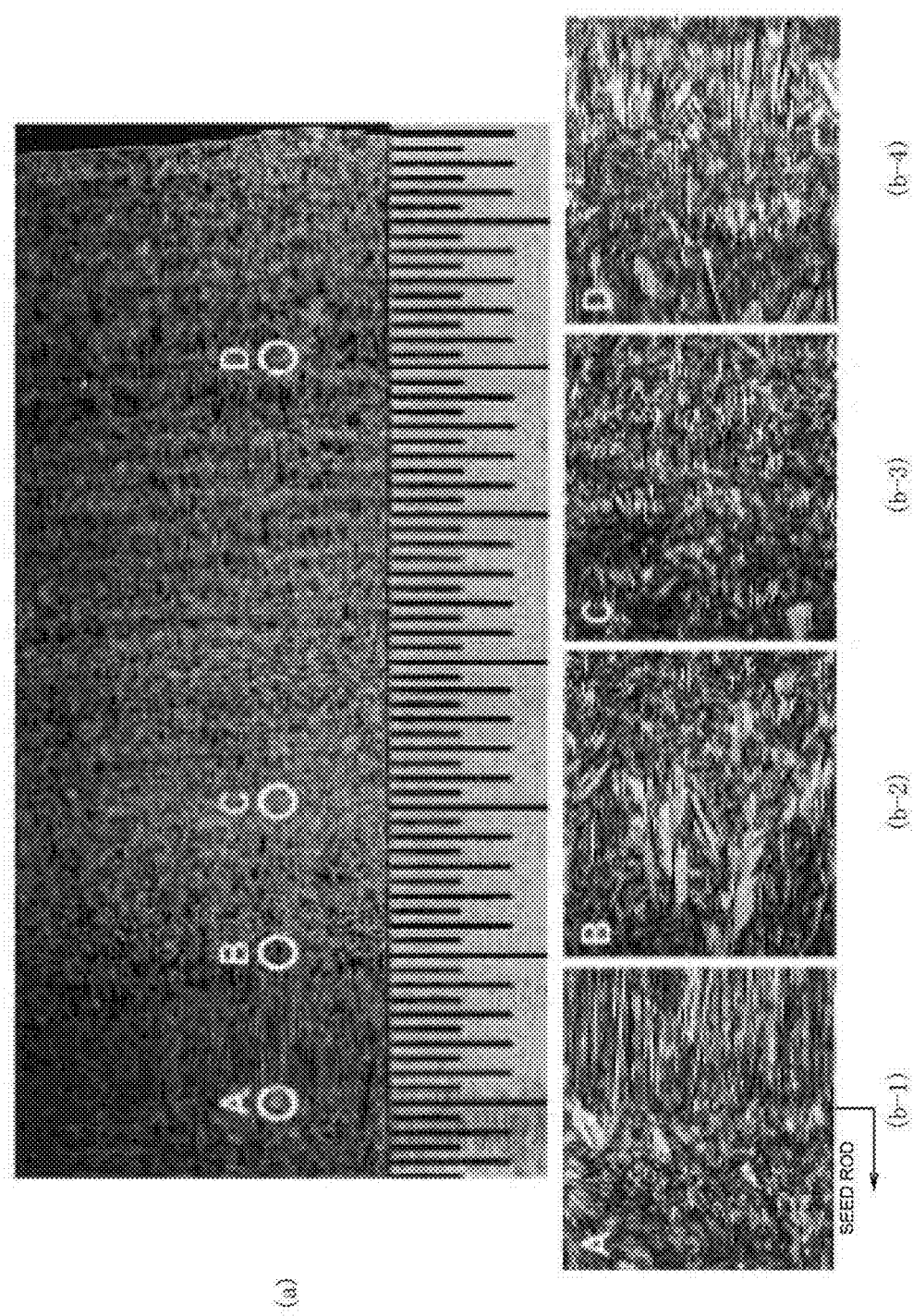
FIG. 3(a) is a photographic view when the cross section perpendicular to the axis of seed rod of the polycrystalline silicon rod of a comparative example 1 is observed by the optical microscope, and FIG. 3(b-1) to FIG. 3(b-4) are photographic views respectively showing, in an enlarged fashion, the part A, the part B, the part C and the part D in the photographic view of FIG. 3(a)
Figure 4:
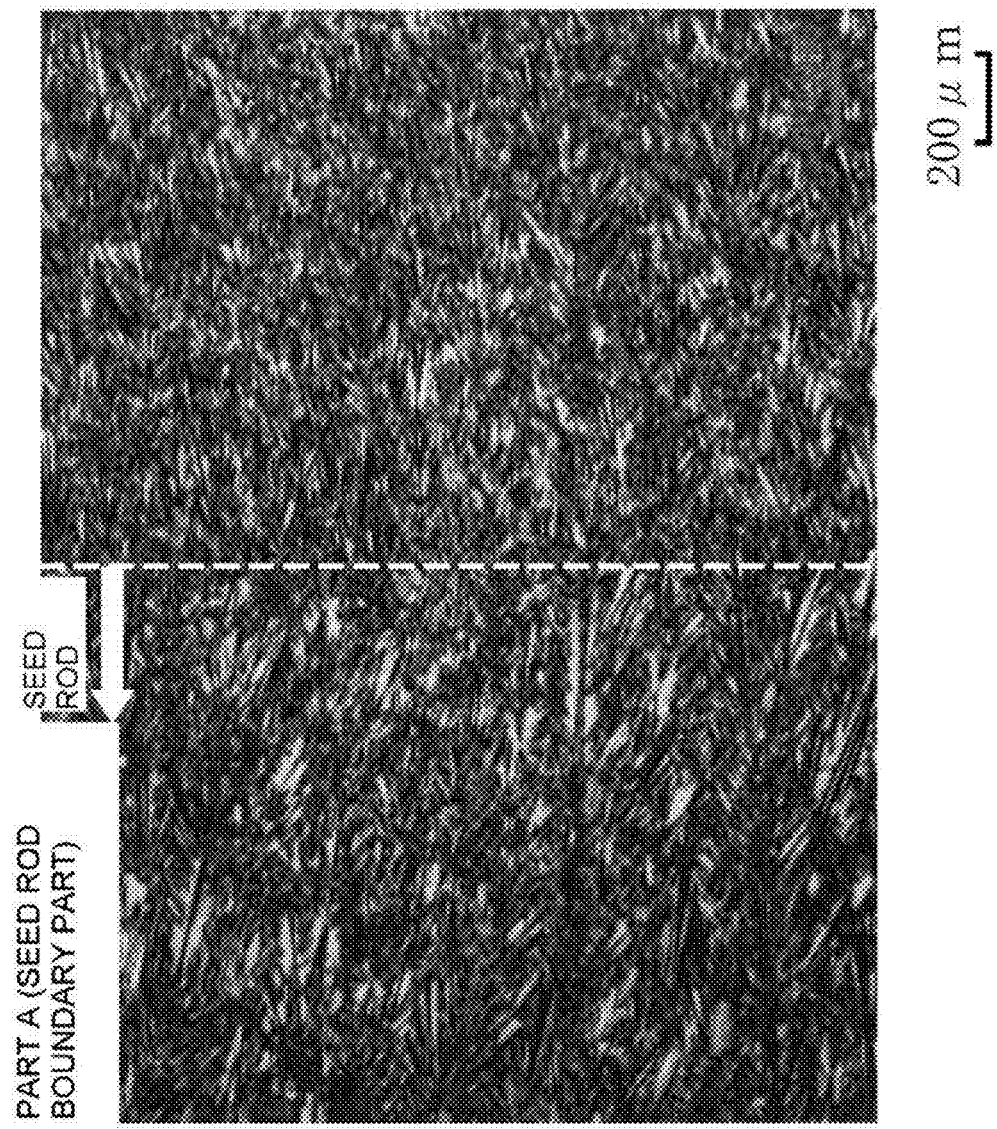
FIG. 4 is a photographic view showing FIG. 2(b-1) in a further enlarged fashion.
Figure 5:
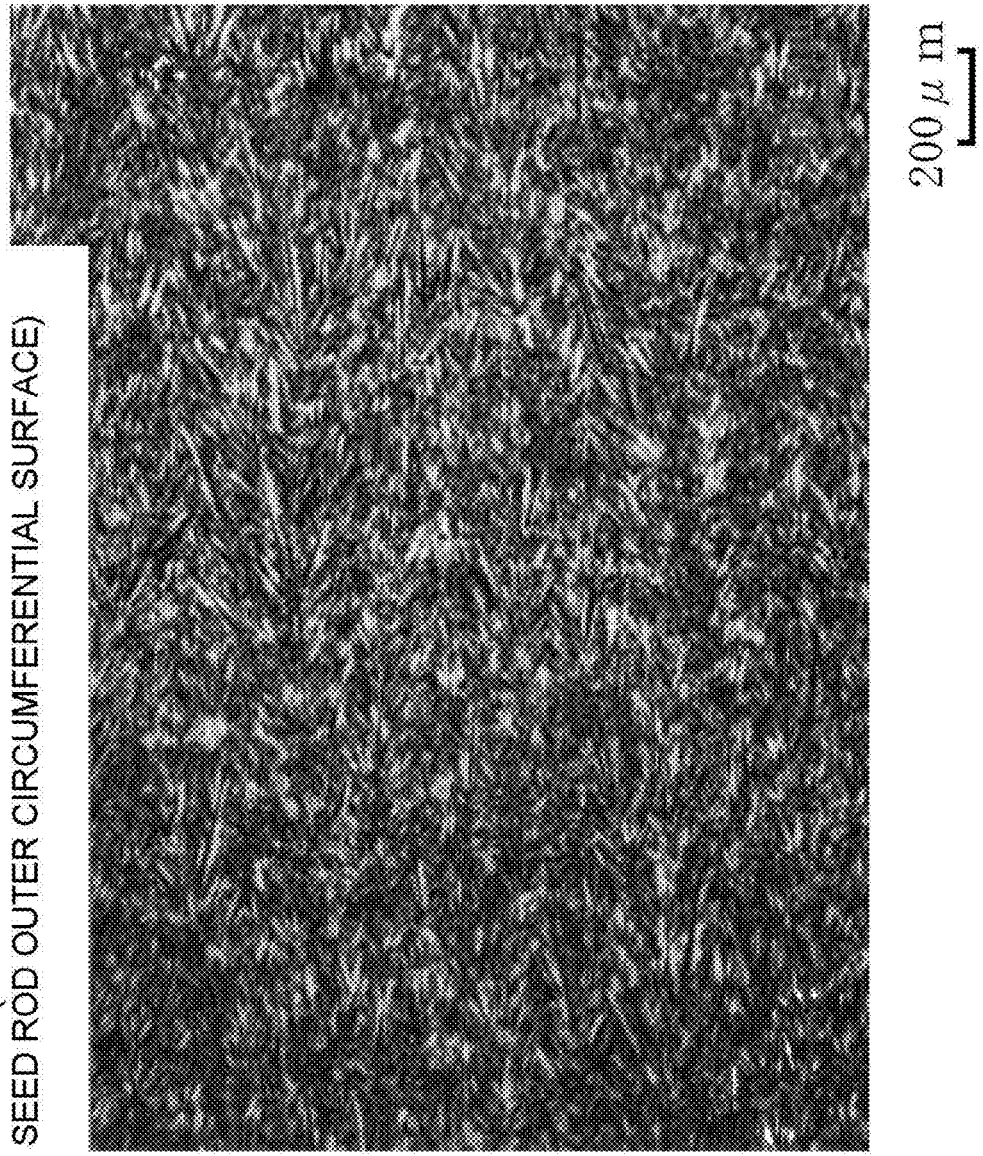
FIG. 5 is a photographic view showing FIG. 2(b-2) in a further enlarged fashion.
Figure 6:
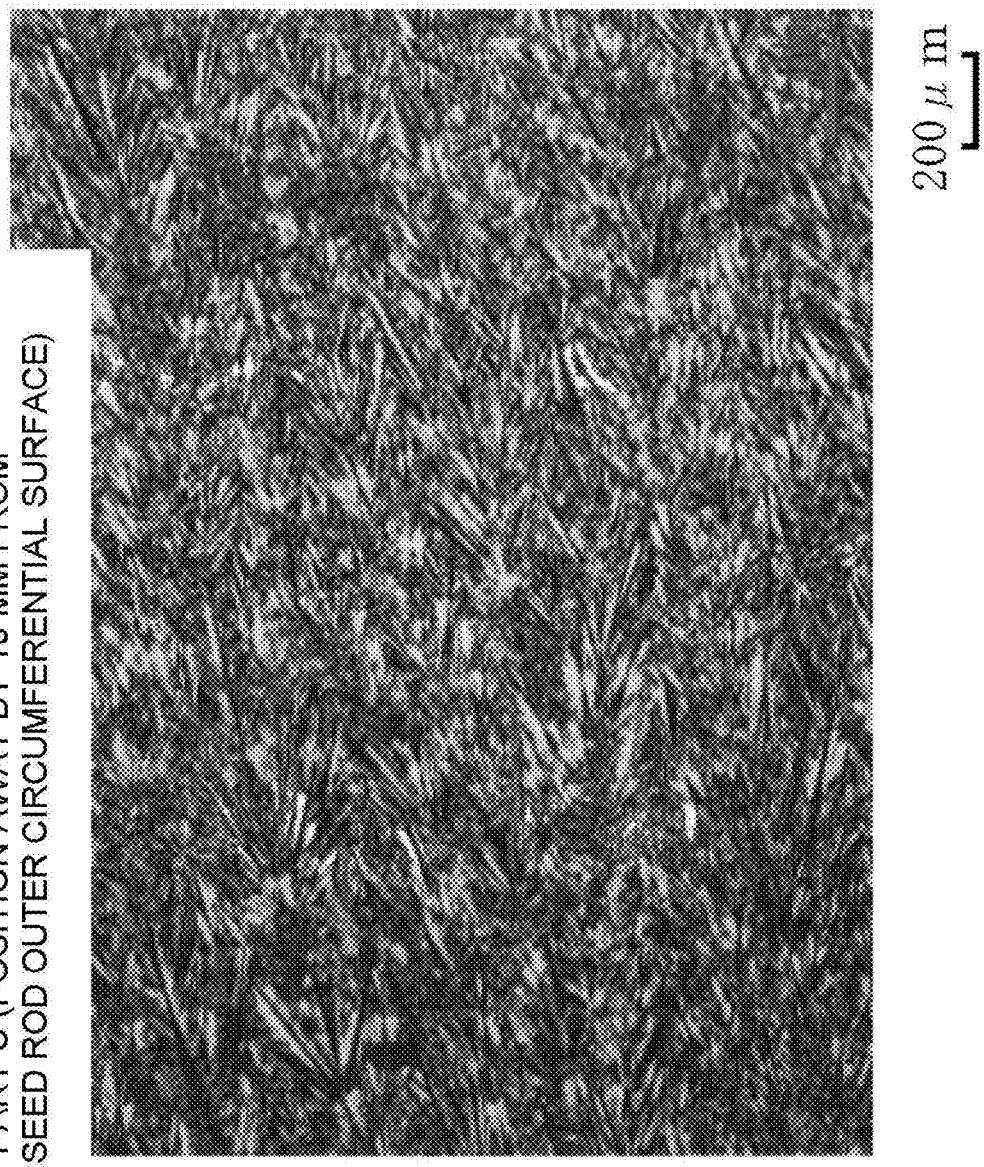
FIG. 6 is a photographic view showing FIG. 2(b-3) in a further enlarged fashion.
Figure 7:
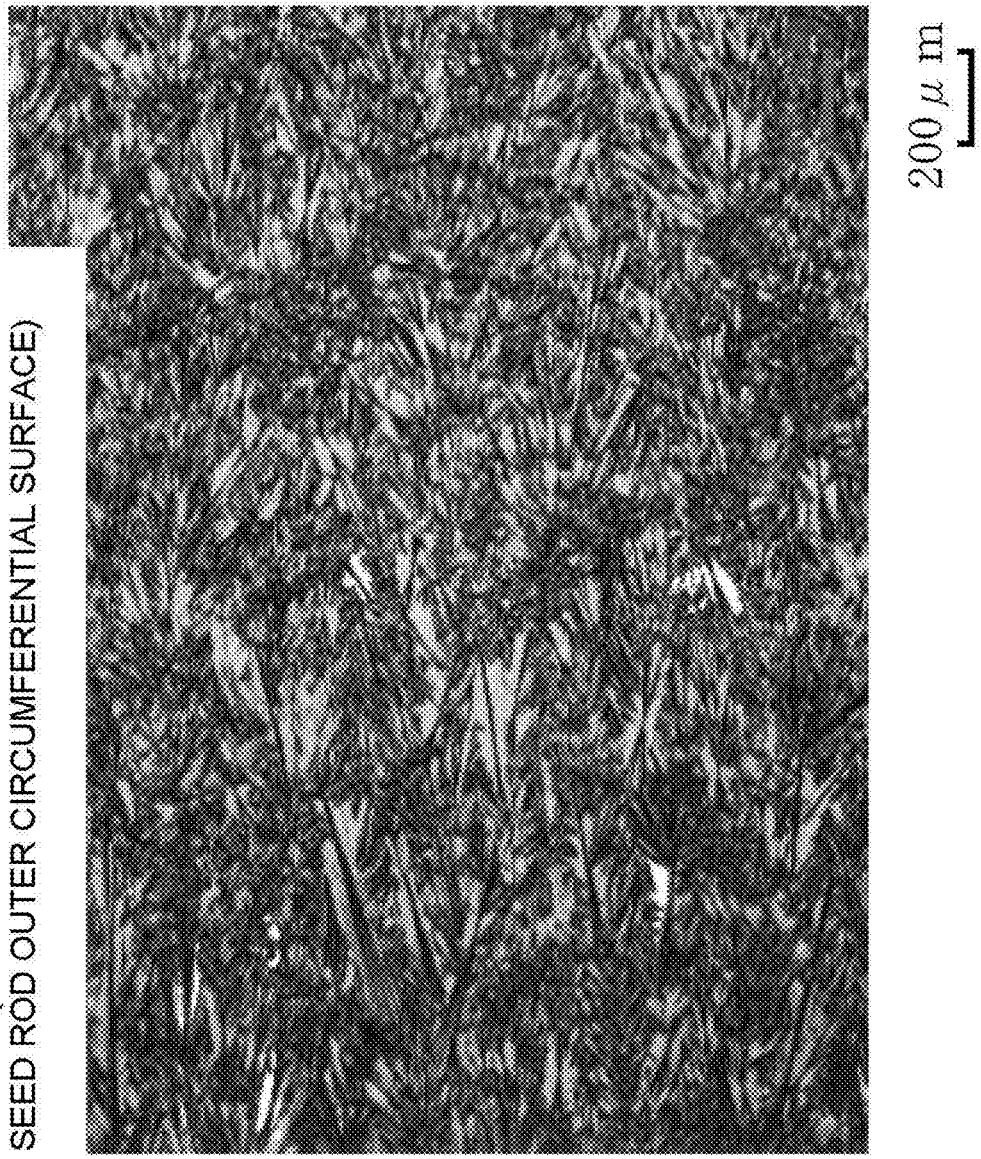
FIG. 7 is a photographic view showing FIG. 2(b-4) in a further enlarged fashion.
Figure 8:
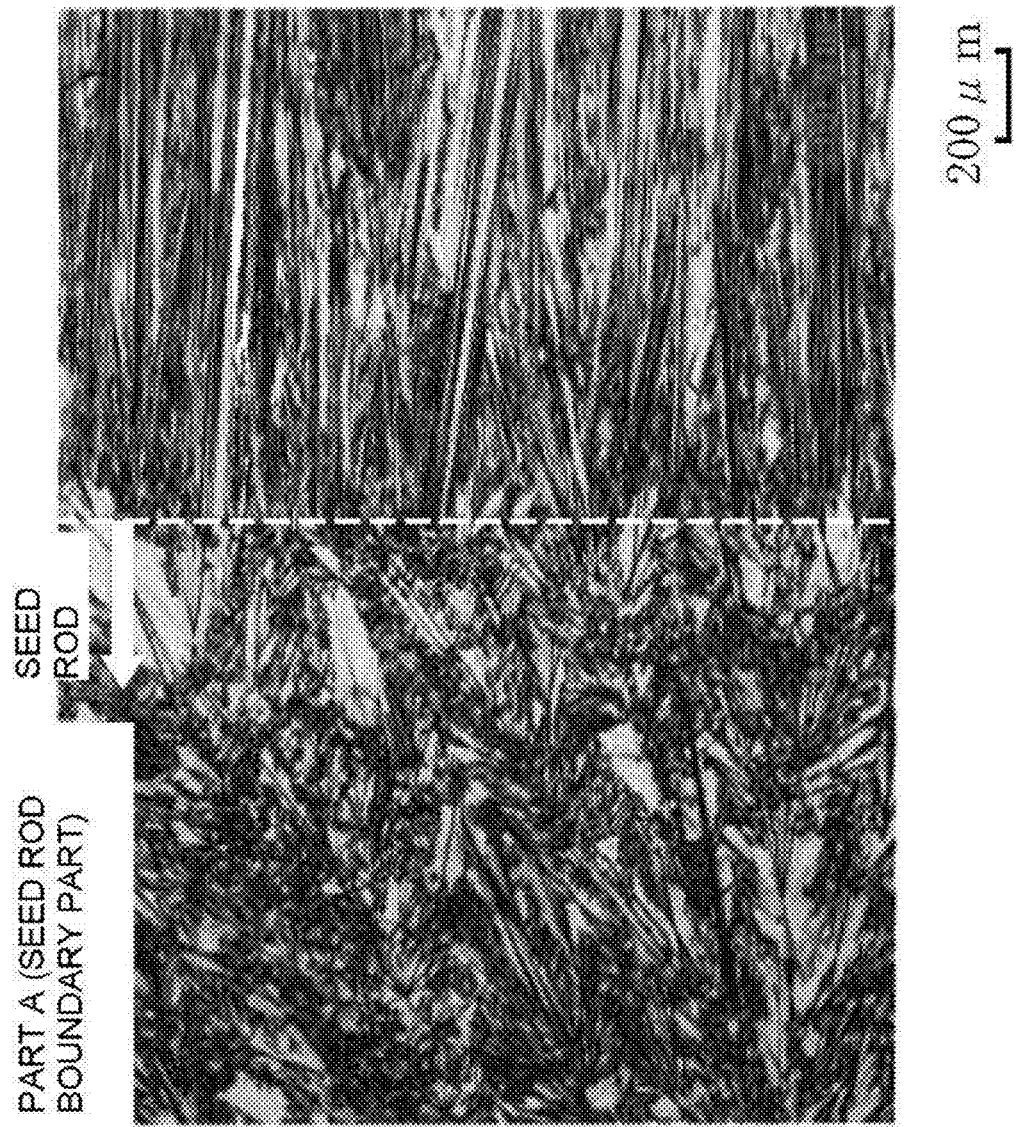
FIG. 8 is a photographic view showing FIG. 3(b-1) in a further enlarged fashion.
Figure 9:
FIG. 9 is a photographic view showing FIG. 3(b-2) in a further enlarged fashion.
Figure 10:
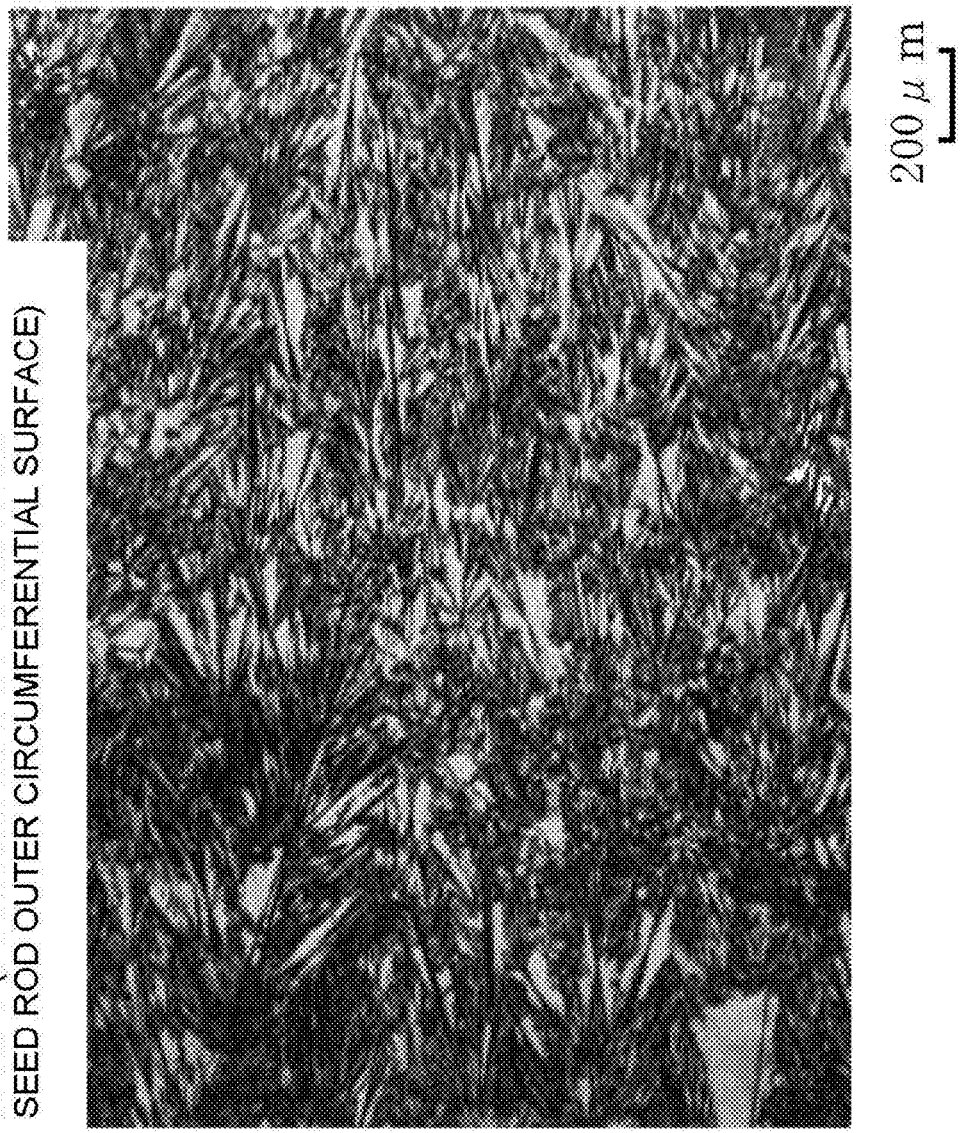
FIG. 10 is a photographic view showing FIG. 3(b-3) in a further enlarged fashion.
Figure 11:
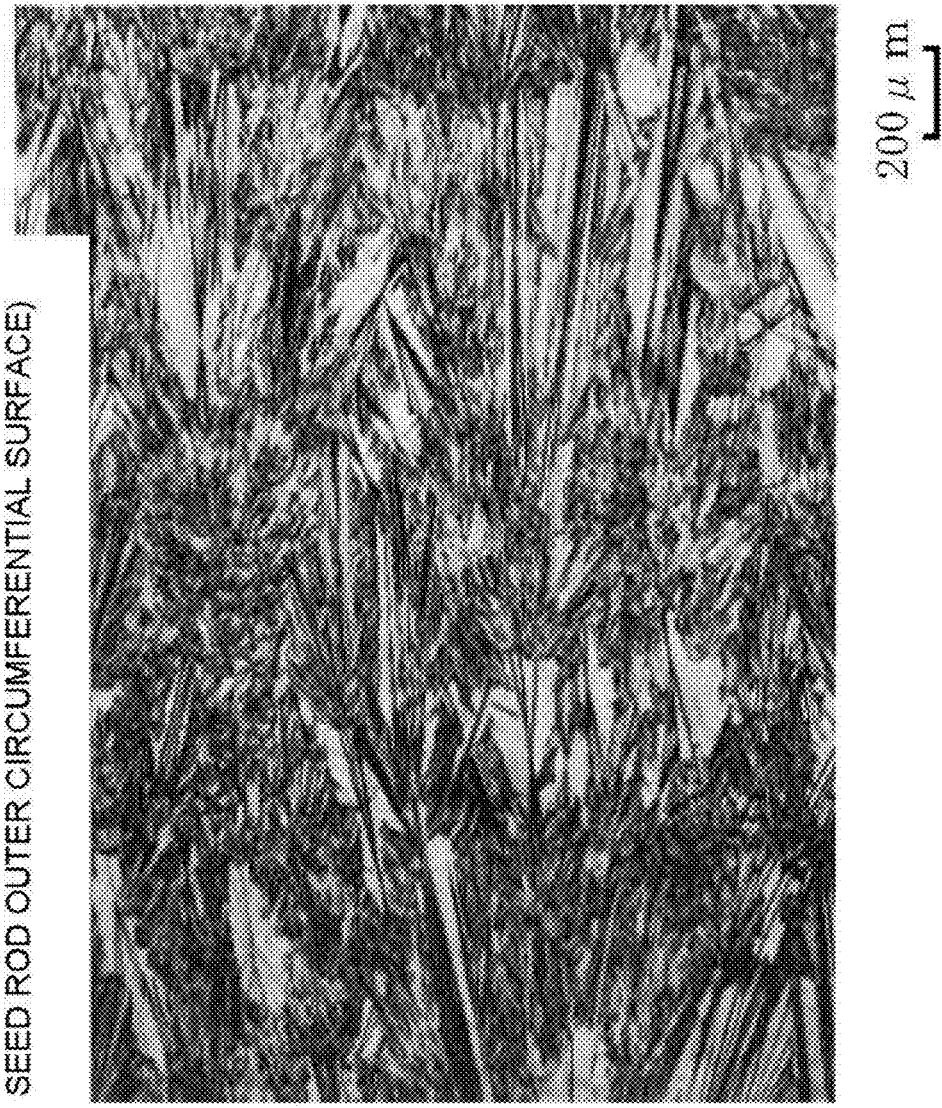
FIG. 11 is a photographic view showing FIG. 3(b-4) in a further enlarged fashion.
Figure 12:
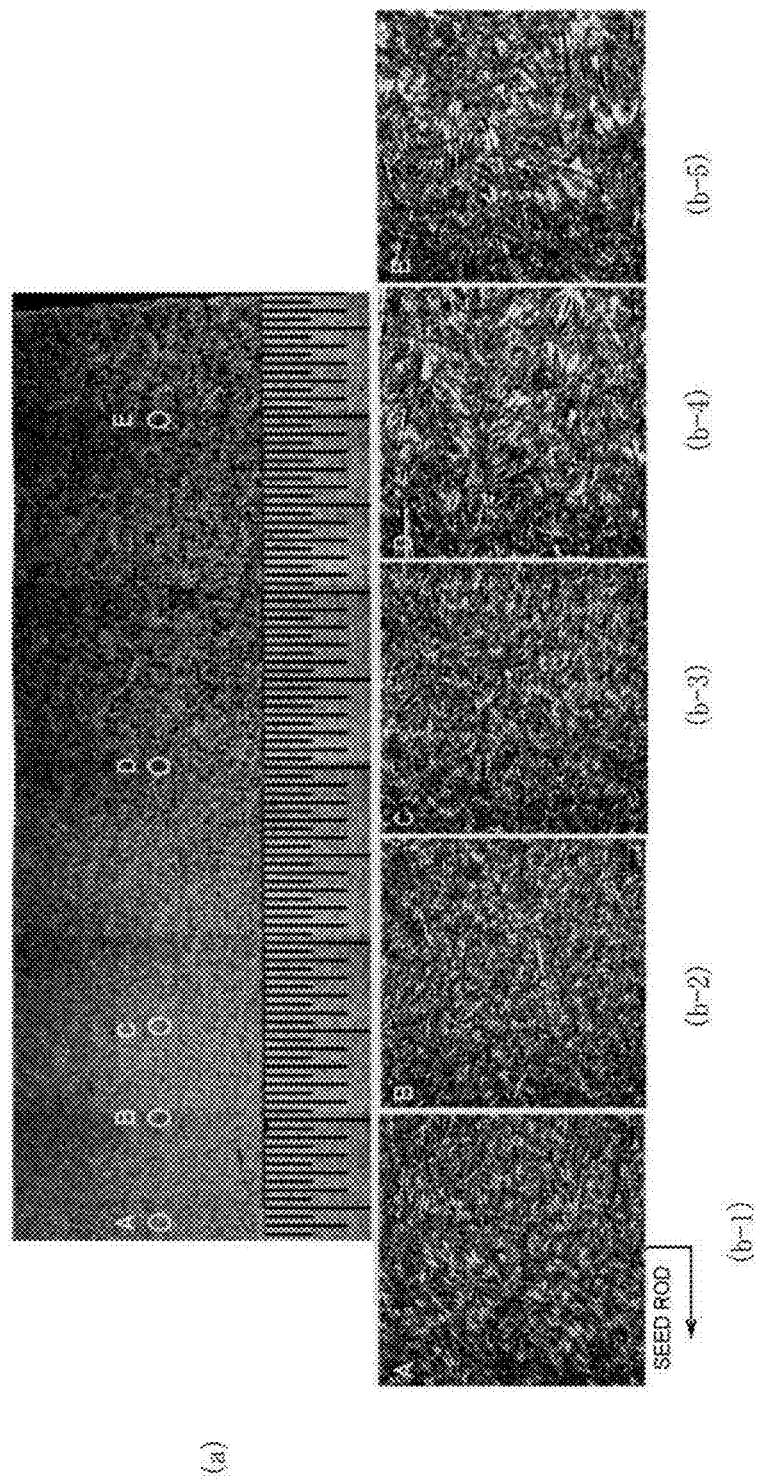
FIG. 12(a) is a photographic view when a polycrystalline silicon rod of the example 2 is observed by means of optical microscope with respect to a cross section perpendicular to the axis of seed rod, and FIGS. 12(b-1) to 12(b-5) are photographic views showing, in an enlarged fashion, the part A, the part B, the part C, the part D and the part E in the photographic views of FIG. 12(a)
Figure 13:
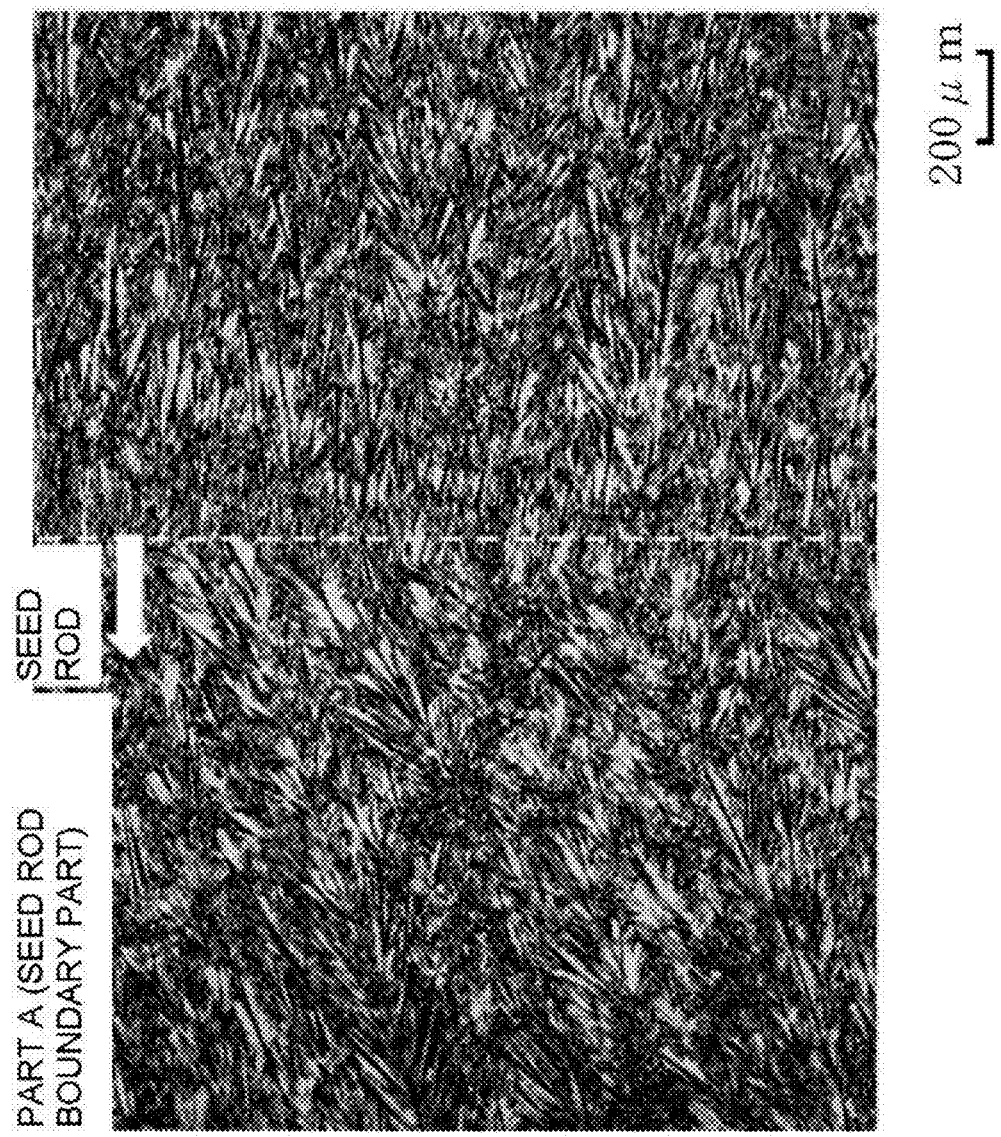
FIG. 13 is a photographic view showing FIG. 12(b-1) in a further enlarged fashion.
Figure 14:
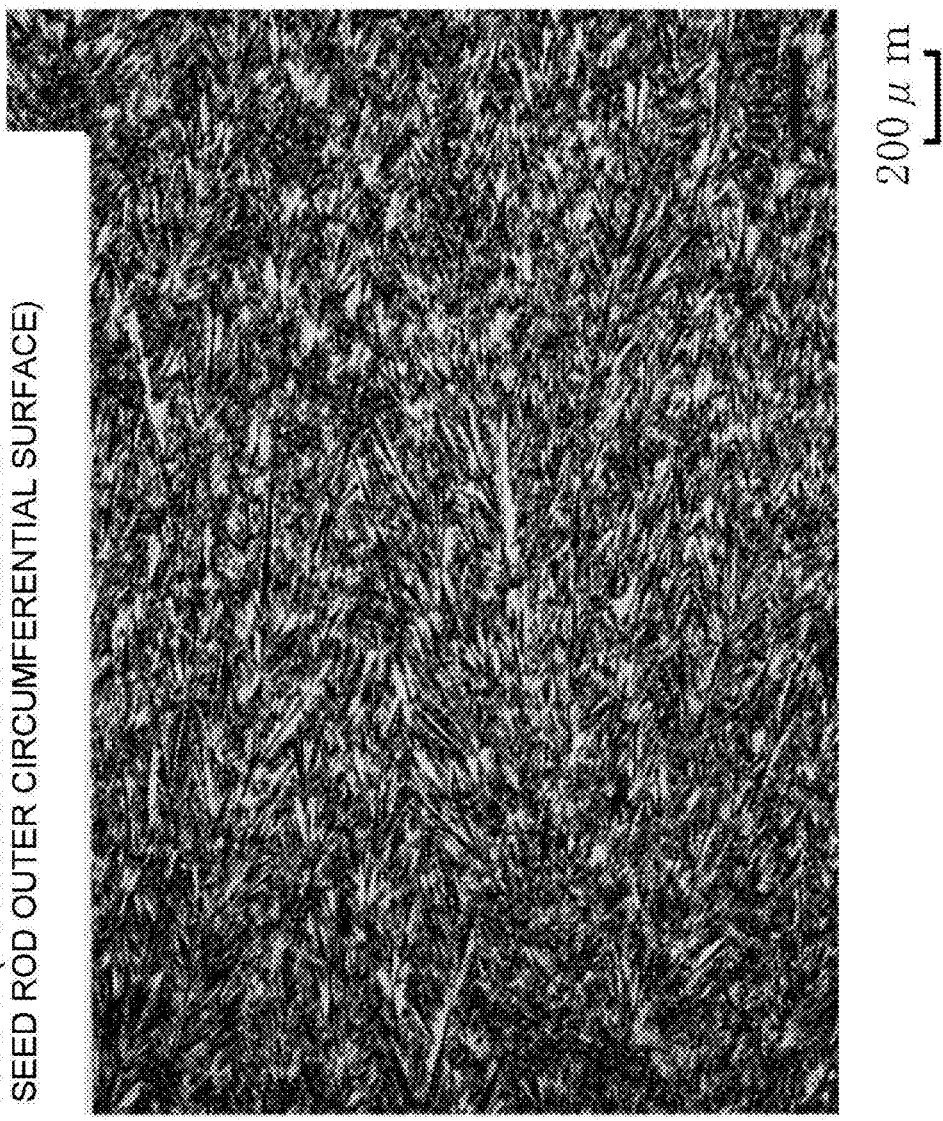
FIG. 14 is a photographic view showing FIG. 12(b-1) in a further enlarged fashion.
Figure 15:
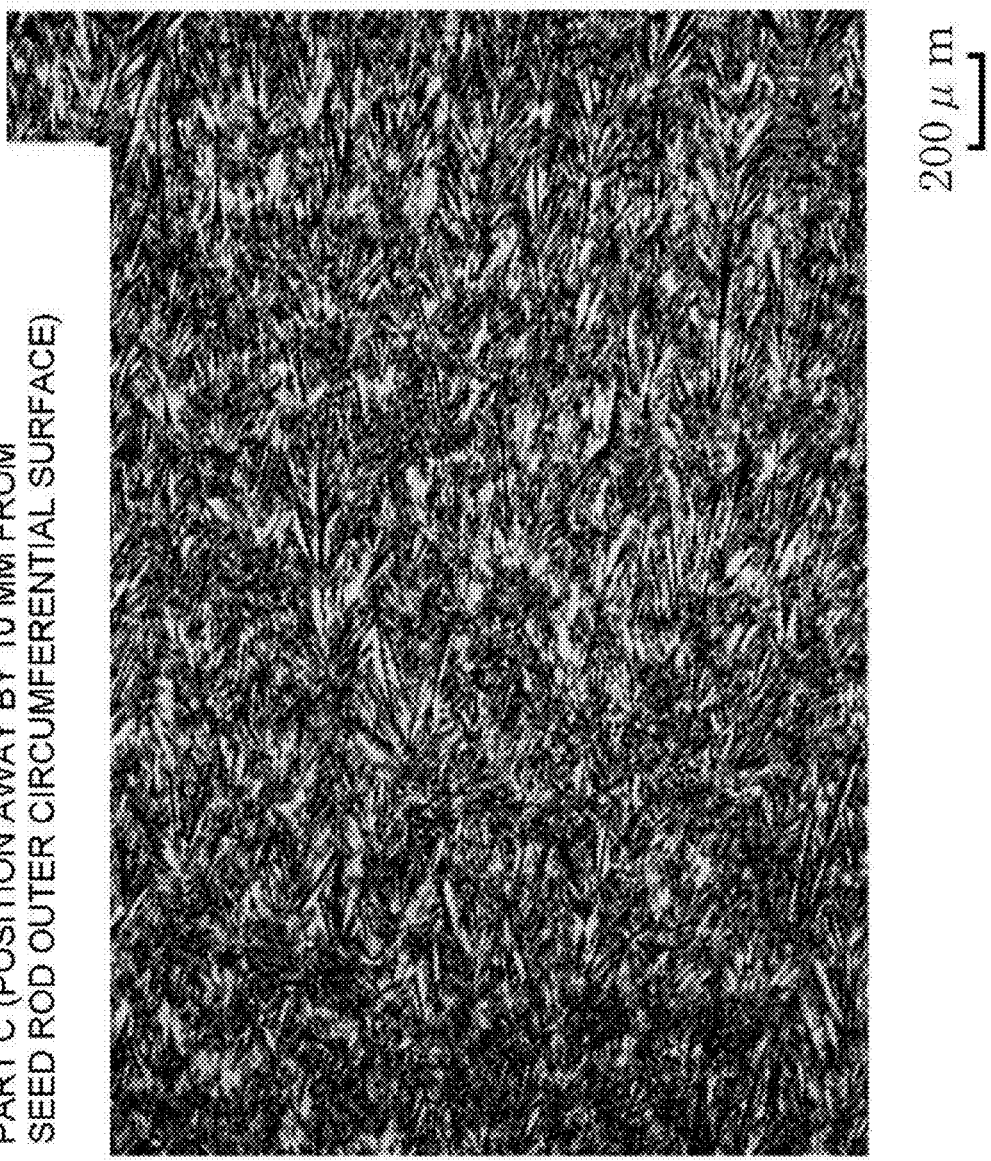
FIG. 15 is a photographic view showing FIG. 12(b-3) in a further enlarged fashion.
Figure 16:
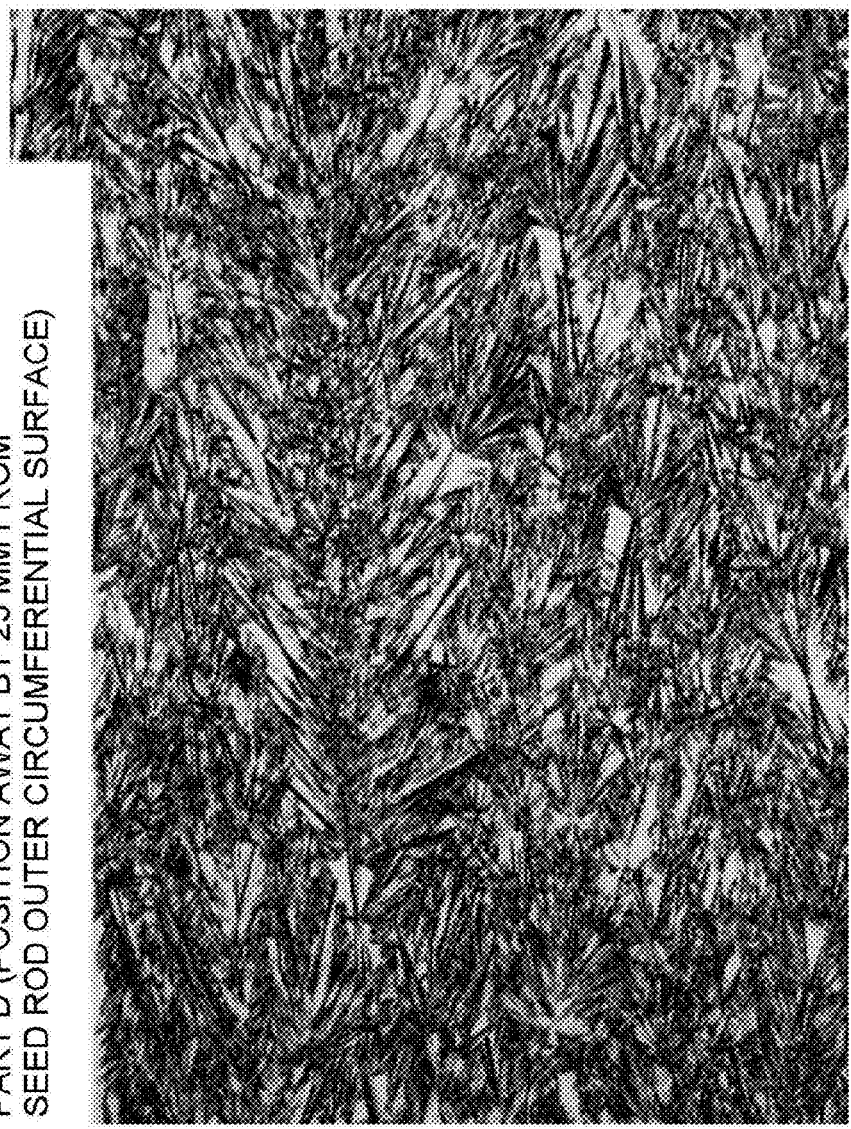
FIG. 16 is a photographic view showing FIG. 12(b-4) in a further enlarged fashion.
Figure 17:
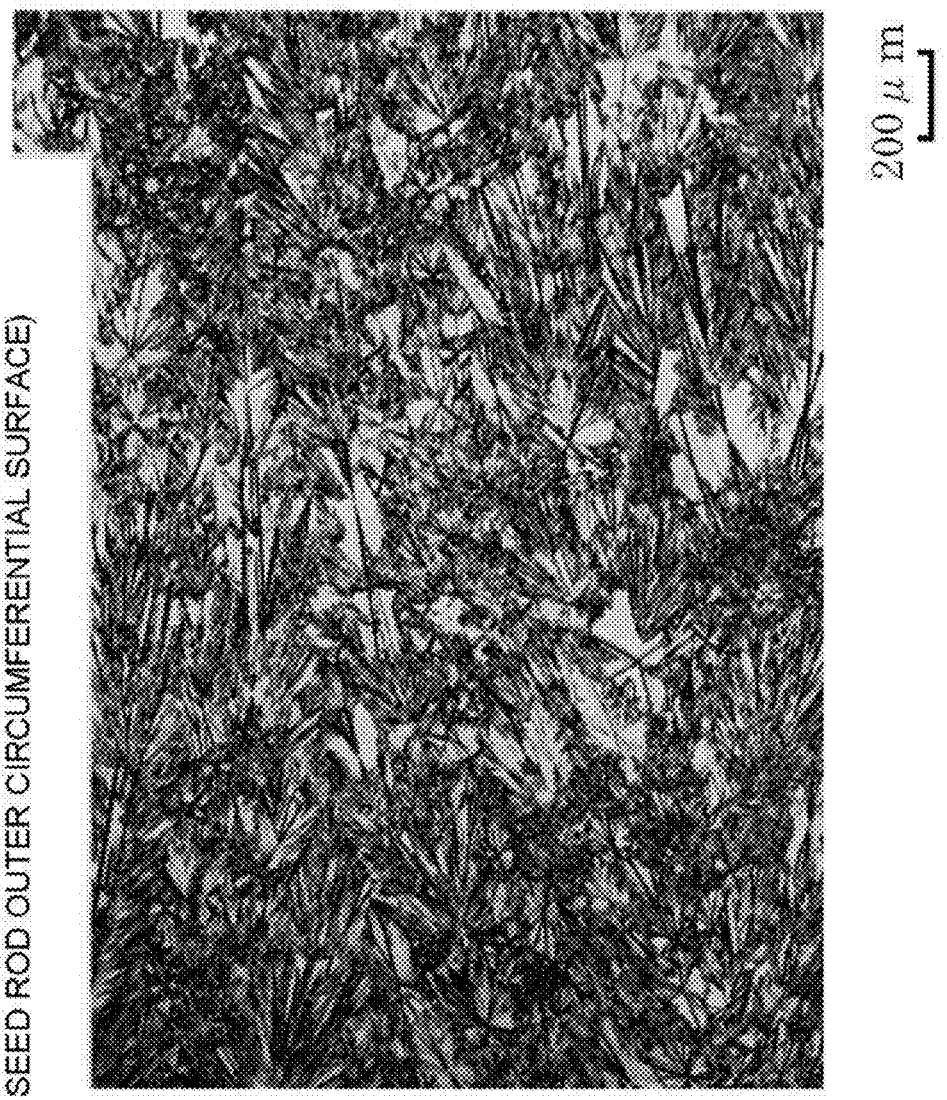
FIG. 17 is a photographic view showing FIG. 12(b-5) in a further enlarged fashion.

Embodiments for carrying out the present invention will now be described with reference to the attached drawings. As illustrated in FIG. 1, in a polycrystalline silicon deposition device 10, a polycrystalline silicon rod 11 used as material for manufacturing single crystal silicon by the FZ method includes a seed rod 11a made of polycrystalline silicon, and a polycrystalline silicon deposit 11b deposited on the outer circumferential surface of the seed rod 11a by the CVD process. The polycrystalline silicon rod 11 is configured so that when observed with respect to a cross section perpendicular to an axis of the seed rod 11a, needle-shaped crystals are uniformly distributed radially with the seed rod 11a being as the center in the polycrystalline silicon deposit 11b. These needle-shaped crystals are formed so that when the diameter of the polycrystalline silicon rod 11 is 77 mm or less, each length thereof is 288 μm or less, and an occupied area percentage on the cross section of the needle-shaped crystal is 78% or more. In this embodiment, the reason why limitation is made such that each length of the needle-shaped crystals is 288 μm or less is that there is high possibility that these needle-shaped crystals may cause occurrence of dislocation resulting from the fact that when coarse needle-shaped crystals beyond 288 μm (excessive needle-shaped crystals) exist in the polycrystalline silicon rod 11, which are difficult to be molten at the time of single-crystallizing the polycrystalline silicon rod 11 by the FZ method. Moreover, the reason why the occupied area percentage of the needle-shaped crystals is limited to 78% or more is that since a considerable number of excessive needle-shaped crystals potentially existing in the polycrystalline silicon deposit 11b is left at the time of single-crystallizing the polycrystalline silicon rod 11 by the FZ method in the case of less than 78%, there is high possibility that these crystals may be developed into dislocation. On the other hand, when the diameter of the polycrystalline silicon rod 11 falls within a range from about above 3 inches (77 mm) to about 6 inches (153 mm), preferably within a range from about above 3 inches (77 mm) to about more than about 5 inches (130 mm) or less, the needle-shaped crystals are formed so that each length thereof is 291 μm or less within a region at least having a diameter of 127 mm, and the occupied area percentage on the cross section of the needle-shaped crystals is formed so that it falls within 15% to 35%. In this case, the reason why the length of the needle-shaped crystals is limited to 291 μm or less is that when coarse needle-shaped crystals (excessive needle-shaped crystals) above 291 μm exist within the polycrystalline silicon rod 11, those balky crystals are difficult to be molten in performing single-crystallization of the polycrystalline silicon rod 11 by the FZ method so that the possibility that these needle-shaped crystals may result in occurrence of cause of dislocation becomes high. Moreover, the reason why the occupied area percentage of the needle-shaped crystals is limited to the range from 15% to 35% is that when it is less than 15%, the productivity of the polycrystalline silicon rod is lowered, whereas when it is above 35%, the polycrystalline silicon rod is difficult to be molten so that in the case where single-crystallization of the polycrystalline silicon rod is performed by the FZ method under the same condition (melting time, etc.), dislocation becomes easy to take place. It is to be noted that crystals of less than 5 μm of observation limit are micro-crystals, and are formed as matrix.

(1) In the case where a polycrystalline silicon rod 11 having a diameter of about 3 inches (77 mm) or less is fabricated, when the polycrystalline silicon rod 11 is observed with respect to a cross section perpendicular to an axis of the seed rod 11a, lengths and widths of needle-shaped crystals at positions away by 5 mm, 10 mm and 25 mm from the outer circumferential surface of the seed rod 11a toward the outside in the radial direction on the same circumference with the axis of the seed rod 11a being as the center are respectively formed as follows. The lengths of the needle-shaped crystals at the position away by 5 mm are distributed so that they are preferably 115 μm or less, and the widths of the needle-shaped crystals at the position away by 5 mm are distributed so that they are preferably 23 μm or less. In this case, needle-shaped crystals each having sizes such that the lengths and the widths of the needle-shaped crystals at the position away by 5 mm are respectively above 115 μm and 23 μm, there is a tendency such that the needle-shaped crystals are difficult to be completely molten according as attention is drawn to parts close to the central part of the polycrystalline silicon rod 11 resulting from the structure of the heating coil at the time of manufacturing single crystal silicon by the FZ method. For this reason, the region around the seed rod 11a is configured so that sizes of the needle-shaped crystals are not above 115 μm in length and 23 μm in width.

Moreover, lengths of the needle-shaped crystals at the position away by 10 mm are distributed so that they preferably fall within the range of 225 μm or less, and widths of the needle-shaped crystals at the position away by 10 μm are distributed so that they preferably fall within the range of 55 μm or less. In this case, each length of the needle-shaped crystals at the position away by 10 mm is not to be above 225 μm, and each width of the needle-shaped crystals is not to be above 55 μm, thereby making it possible to securely perform melting process of the needle-shaped crystals in single-crystallization based on the FZ method, and to reduce the possibility of occurrence of dislocation and to limit the percentage of the needle-shaped crystals over the entire circumference thereof thus to have ability to stably perform control of single-crystallization.

Further, lengths of needle-shaped crystals at the position away by 25 mm are distributed so that they are preferably 288 μm or less, and widths of the needle-shaped crystals at the position away by 25 μm are distributed so that they are preferably 48 μm or less. In this case, control of sizes and percentages is performed such that the lengths of needle-shaped crystals at the position away by 25 mm are caused not to be above 288 μm, and the widths of needle-shaped crystals are caused not to be above 48 μm, thereby making it possible to stably perform melting process of crystals at parts in the vicinity of the outer circumference even in the case of the polycrystalline silicon rod 11 for FZ having a diameter of about 3 inches (77 μm) or less. Thus, the possibility of dislocation is reduced to easily perform control of single-crystallization.

It is to be noted that in the case where a polycrystalline silicon rod having a diameter of about 3 inches (77 mm) or less is fabricated, when the seed rod 11a is observed with respect to the cross section perpendicular to the axis of the seed rod 11a together with the polycrystalline silicon rod 11, lengths of needle-shaped crystals in the seed rod 11a are distributed so that they are preferably 135 μm or less, and widths of needle-shaped crystals in the seed rod 11a are distributed so that they are preferably 45 μm or less. In this case, in needle-shaped crystals such that lengths and widths of needle-shaped crystals of sizes in the seed rod 11a are respectively above 135 μm and 45 μm, there is a deficiency such that needle-shaped crystals are difficult to be completely molten according as attention is drawn to parts closer to the central part of the polycrystalline silicon rod 11 resulting from the structure of heating coil at the time of manufacturing single crystal silicon by the FZ method. For this reason, for the purpose of suitably melting the seed rod 11a, it is necessary to control the lengths and/or widths of the needle-shaped crystals. Further, preferably, those lengths and/or widths are formed to be the same as lengths and/or widths of needle-shaped crystals around the seed rod 11a (a part close to the seed rod 11a in the polycrystalline silicon deposit 11b) or less, thereby making it possible to stably continuously perform melting process. Thus, occurrence of dislocation can be reduced to a large degree.

(2) In the case where a polycrystalline silicon rod 11 having a diameter within the range from about above 3 inches (77 mm) to about 6 inches (153 mm) or less, preferably within a range from about above 3 inches (77 mm) to about more than 5 inches (130 mm) or less is fabricated, when the polycrystalline silicon rod 11 is observed with respect to a cross section perpendicular to an axis of the seed rod 11a, lengths and widths of needle-shaped crystals at portions away by 5 μm, 10 mm, 25 mm and 45 μm from the outer circumferential surface of the seed rod 11a toward the outside in the radial direction on the same circumference with the axis of the seed rod 11a being as the center are respectively formed as follows. The lengths of the needle-shaped crystals at the position away by 5 mm are distributed so that they are preferably 226 μm or less, and the widths of the needle-shaped crystals at the position away by 5 mm are distributed so that they are preferably 30 μm or less. In this case, needle-shaped crystals each having sizes such that the lengths and the widths of the needle-shaped crystals at the position away by 5 mm are respectively above 226 μm and 30 μm, there is a deficiency such that according as attention is drawn to the central part of the polycrystalline silicon rod 11, the needle-shaped crystals are difficult to be completely molten, resulting from the structure of heating coil at the time of manufacturing single crystal silicon based on the FZ method. For this reason, the region around the seed rod 11a is configured so that sizes of the needle-shaped crystals are not above 226 μm in terms of the length and 30 μm in terms of the width.

Moreover, lengths of the needle-shaped crystals at the position away by 10 mm are distributed so that they preferably fall within the range of 241 μm or less, and widths of the needle-shaped crystals at the position away by 10 mm are distributed so that they preferably fall within the range of 34 μm or less. In this case, each length of the needle-shaped crystals at the position away by 10 mm is formed not to be above 241 μm, and each width of the needle-shaped crystals is formed not to be above 34 μm, thereby making it possible to securely perform melting process of the needle-shaped crystals in single-crystallization based on the FZ method, and to reduce the possibility of occurrence of dislocation. And by limiting the percentage of the needle-shaped crystals over the entire circumference thereof, it becomes possible to stably perform control of single-crystallization.

Moreover, lengths of the needle-shaped crystals at the position away by 25 mm are distributed so that they preferably fall within the range of 271 μm or less, and widths of the needle-shaped crystals at the position away by 25 mm are distributed so that they preferably fall within the range of 45 μm or less. In this case, each length of the needle-shaped crystals at the position away by 25 mm is formed not to be above 271 μm, and each width of the needle-shaped crystals is formed not to be above 45 μm, thereby making it possible to securely perform melting process of the needle-shaped crystals in single-crystallization based on the FZ method, and to reduce the possibility of occurrence of dislocation. And by limiting the percentage of the needle-shaped crystals over the entire circumference thereof, it becomes possible to stably perform control of single-crystallization.

Further, lengths of needle-shaped crystals at the position away by 45 mm are distributed so that they are preferably 291 μm or less, and widths of the needle-shaped crystals at the position away by 45 mm are distributed so that they are preferably 44 μm or less. In this case, control of sizes and percentages is performed such that the lengths of needle-shaped crystals at the position away by 45 mm are formed not to be above 291 μm, and the widths of needle-shaped crystals are formed not to be above 44 μm, thereby making it possible to stably perform melting process of crystals at parts in the vicinity of the outer circumference even in the case of the polycrystalline silicon rod 11 for FZ having a diameter within the range from about above 3 inches (77 mm) to about 6 inches (153 mm) or less. Thus, the possibility of dislocation is reduced to have ability to easily perform control of single-crystallization.

It is to be noted that in the case where a polycrystalline silicon rod having a diameter within the range from about above 3 inches (77 mm) to about 6 inches (153 mm) or less is fabricated, when the seed rod 11a is observed with respect to the cross section perpendicular to the axis of the seed rod 11a together with the polycrystalline silicon rod 11, lengths of needle-shaped crystals in the seed rod 11a are distributed so that they are preferably 264 μm or less, and widths of needle-shaped crystals in the seed rod 11a are distributed so that they are preferably 31 μm or less. In this case, when lengths and widths of needle-shaped crystals in the seed rod 11a are respectively above 364 μm and 31 μm, there is a deficiency such that needle-shaped crystals are difficult to be completely molten. The region closer to the central part of the polycrystalline silicon rod 11 is hard to be molten, that results from the structure of heating coil at the time of manufacturing single crystal silicon by the FZ method. For this reason, for the purpose of stably melting the seed rod part (including seed rod and a part deposited from the seed rod), it is necessary to control the length and/or the width of the needle-shaped crystals. Further, preferably, those lengths and/or widths are formed to be the same as lengths and/or widths of needle-shaped crystals around the seed rod 11a (a region close to the seed rod 11a in the polycrystalline silicon deposit 11b) or less, thereby making it possible to stably continuously perform melting process. Thus, occurrence of dislocation can be reduced to a large degree.

The polycrystalline silicon deposit 11b constituted in this way is deposited by the polycrystalline silicon depositing device 10. This polycrystalline silicon depositing device 10 comprises a reactor 12, and a supply pipe 14 and an exhaust pipe 16 which are attached in a manner penetrated through the reactor 12. The reactor 12 comprises a base plate 12a constituting the bottom part thereof, and a bell jar 12b including a cylindrical body of which upper side is closed to be dorm-shaped. On the base plate 12a, there are provided a pair of these electrodes 12c, 12c for holding the lower end of a Π-shaped seed rod 11a in a manner penetrated therethrough. The seed rod 11a is held by electrodes 12c, 12c so that it is fixed within the reactor 12. An output terminal of a power supply 13 is electrically connected to the pair of electrodes 12c, 12c, and the seed rod 11a is configured so that it can be heated by power from the power supply 13. The supply pipe 14 and the exhaust pipe 16 are respectively, made of, e.g., stainless steel, and are attached in a manner penetrated through the base plate 12a. A configuration such that mixture gas of, e.g., trichlorosilane (TCS:SiHCl₃) and hydrogen is introduced as raw material gas from the supply pipe 14 into the reactor 12 is adopted. Additionally, reference numeral 17 in FIG. 1 denotes an insulator for electrically isolating the electrodes 12c, 12c from the base plate 12a.

A method of depositing a polycrystalline silicon deposit 11b by using the depositing device 10 constituted in this way will be described as follows. The seed rod 11a made of polycrystalline silicon is fabricated in advance. The seed rod 11a may be fabricated by shaving or cutting a polycrystalline silicon rod so as to take a square rod shape to assemble the rod thus obtained so as to take Π-shaped, or may be fabricated by connecting a plurality of square polycrystalline silicon rods to assemble the rods thus obtained so as to take Π-shaped. It is to be noted that it is preferable to allow the seed rod 11a to undergo surface treatment by using chemical liquids of acid (e.g., mixed liquid of nitric acid and hydrofluororic acid, etc.) before use. Thus, it is possible to remove impurities or oxide films, etc. attached or formed on the surface of the seed rod 11a. By this process, lesser pollutant high purity polycrystalline silicon deposit 11b can be obtained, and cases to produce defects and/or pores such as voids which are apt to take place in the deposition initial stage of the polycrystalline silicon deposit 11b can be reduced. Accordingly, it is possible to form, on the surface of the seed rod 11a, polycrystalline silicon deposit 11b of uniform crystal structure. First, the seed rod 11a is disposed within the reactor 12. The arrangement of the seed rod 11a is performed by allowing the electrodes 12c, 12c provided on the base plate 12a to hold the lower end of the seed rod 11a. Further, the seed rod 11a is pre-heated by means of heater in the reactor, etc. thereafter energization was performed through electrodes 12c, 12c by means of the power supply 13 to heat the seed rod 11a. The heating temperature is a predetermined temperature (e.g., about 1100° C.) within the range from about 1000 to 1300° C. In correspondence with heating of the seed rod 11a, mixture gas of trichlorosilane (TCS: SiHCl₃) and hydrogen is introduced as raw material gas from the supply pipe 14 into the reactor 12. The gas thus introduced rises within the reactor 12 which is heated by the heated high temperature seed rod 11a, During convection of gas, trichlorosilane (TCS:SiHCl₃) is thermally decomposed or is reduced by hydrogen as indicated by the following formulas (1) and (2) so that polycrystalline silicon deposit 11b is deposited on the surface of the seed rod 11a.

$$4SiHCl_3 \rightarrow Si + 3SiCl_4 + 2H_2 \quad (1)$$

$$SiHCl_3 + H_2 \rightarrow Si + 3HCl \quad (2)$$

In this embodiment, it is preferable that, in the initial stage of the deposition reaction, a current value caused to flow through the seed rod 11a is temporarily suppressed down to a lower value. For example, the current value is momentarily suppressed down to about ⅕ of the maximum setup current value in the reaction process in the case of the polycrystalline deposit 11b having a diameter of about 3 inches (77 mm) or less, and to about ⅕₀ of the maximum setup current value in the reaction process in the case of the polycrystalline silicon deposit 11b having a diameter within the range from about above 3 inches (77 mm) and about 6 inches (153 mm), thereafter to gradually elevate the current value in correspondence with an increase in the diameter of the polycrystalline silicon deposit 11b. Thus, in the initial deposition process of the polycrystalline silicon deposit 11b, formation of coarse needle-shaped crystals is suppressed so that needle-shaped crystals equal to those of the seed rod 11a or smaller than those of the seed rod 11a can be formed. Moreover, it is possible to suppress formation of pores called voids on the seed rod surface. Further, it is preferable that, in the deposition reaction, the molar ratio of hydrogen to trichlorosilane is gradually increased from about 4/1 (hydrogen/trichlorosilane) in correspondence with an increase of the diameter of the polycrystalline silicon deposit 11b, and is about 8/1 at the maximum. Thus, it is possible to stably suppress formation of coarse needle-shaped crystals in the polycrystalline silicon deposit 11b. Further, production of powdered silicon is suppressed, and generation of pimples (projections) on the polycrystalline silicon deposit 11b which is considered resulting from cause such as powdered silicon, etc. is also suppressed so that a polycrystalline silicon deposit 11b which is uniform and is smooth on the surface thereof can be obtained. Furthermore, it is preferable that, flow rate of raw material gas is maintained at a predetermined flow rate in the initial stage of the deposition reaction, thereafter the flow rate is gradually increased to allow the maximum to be three times to six times larger than the initial flow rate of the maximum flow rate. Thus, deposit amount of the polycrystalline silicon deposit 11b can be maintained and the diameter of the polycrystalline can be constant over the entire length of the polycrystalline silicon rod 11. It is to be noted that, sub-product by thermal decomposition or reduction reaction such as tetrachlorosilane or hydrogen chloride, etc. and/or unreacted trichlorosilane or hydrogen, etc. are exhausted as exhaust gas from the reactor in the series of reaction process steps, whereupon the exhaust gas thus obtained is processed within the processing system outside the system and recovery, etc. is then performed.

After the deposition reaction is completed, a current caused to flow in the polycrystalline silicon rod 11 is lowered stepwise to gradually lower temperature of the seed rod 11a. This is because since when a current caused to flow in the polycrystalline silicon rod 11 is abruptly lowered, thermal strain in the polycrystalline silicon rod 11 is increased, crack may take place at the time of recovery of the polycrystalline silicon rod 11 (at the time of taking-out from the reactor 12), and the polycrystalline silicon rod 11 may be apt to be broken at the time of single-crystallization by the FZ method. It is to be noted that the seed rod 11a may be fabricated by using the polycrystalline silicon rod 11 fabricated in this way. Thus, it is possible to provide a seed rod 11a which does not include coarse needle-shaped crystals in the seed rod 11a.

(1) In the case a polycrystalline silicon rod 11 having a diameter of about 3 inches (77 mm) or less, as described above, in the polycrystalline silicon rod 11 in which the polycrystalline silicon deposit 11b is deposited on the outer circumferential surface of the seed rod 11a, needle-shaped crystals in the polycrystalline silicon deposit 11b are formed so that each length thereof does not above 288 μm. In addition, the occupied area percentage of the needle-shaped crystals is 78% or more, whereby very few unmolten needle-shaped crystals causing defect in the single crystal silicon during heating and molding the polycrystalline silicon rod 11 for single-crystallization by the FZ method are left, resulting in extremely low possibility that dislocation may take place. Moreover, micro crystals are formed so that lengths of needle-shaped crystals in the polycrystalline silicon deposit 11b are not above 288 μm, thereby making it possible to suppress formation of voids taking place in the process of crystal deposition. For this reason, there can be provided a uniform crystal structure. Further, since needle-shaped crystals in the seed rod 11a are formed so that each length is not above 288 μm, unmolten crystals are difficult to generate at the time of melting the seed rod 11a in the single crystal silicon manufacturing process by the FZ method, thus to have ability to reduce occurrence of dislocation. As described above, when the polycrystalline silicon rod 11 is single-crystallized by the FZ method in this way, no dislocation takes place and control at time of single-crystallization can be stably performed. Here, in the case a polycrystalline silicon rod 11 having a diameter of about 3 inches (77 mm) or less, it is considered that since sizes of needle-shaped crystals do not vary widely, the control so as to generate a more amount of needle-shaped crystals reduced in size up to an appropriate size, results in that excessive needle-shaped crystals do not remain.

(2) In the case of a polycrystalline silicon rod 11 having a diameter within the range from about above 3 inches (77 mm) to about 6 inches (153 mm), as described above, in the polycrystalline silicon rod 11 in which the polycrystalline silicon deposit 11b is deposited on the outer circumferential surface of the seed rod 11a, needle-shaped crystals in the polycrystalline silicon deposit 11b are formed so that each length thereof does not above 291 µm. In addition, the occupied area percentage of the needle-shaped crystals is caused to fall within the range from 15% to 35%, whereby very few unmolten needle-shaped crystals causing defect in the single crystal silicon during heating and molding the polycrystalline silicon rod 11 for single-crystallization by the FZ method are left, resulting in extremely low possibility that dislocation may take place. Moreover, micro crystals are formed so that lengths of needle-shaped crystals in the polycrystalline silicon deposit 11b are not above 291 µn, thereby making it possible to suppress formation of voids taking place in the process of crystal deposition. For this reason, there can be provided a uniform crystal structure. Further, since needle-shaped crystals in the seed rod 11a are formed so that each length is not above 291 µm, unmolten crystals are difficult to generate at the time of melting the seed rod 11a in the single crystal silicon manufacturing process by the FZ method, thus to have ability to reduce occurrence of dislocation. As described above, when the polycrystalline silicon rod 11 is single-crystallized by the FZ method in this way, no dislocation takes place and control at time of single-crystallization can be stably performed. Here, in the case a polycrystalline silicon rod 11 having a diameter of about above 3 inches (77 mm), it is considered that since sizes of needle-shaped crystals vary widely, the control so as to suppress an incidence of needle-shaped crystals reduced in size up to an appropriate size within the range from 15% to 35%, results in that excessive needle-shaped crystals are concurrently suppressed.

EXAMPLE

Examples according to the present invention will be described in detail along with a comparative example as follows.

First Example

A polycrystalline silicon depositing device 10 shown in FIG. 1 was used to deposit polycrystalline silicon deposit 11b on the outer circumferential surface of the seed rod 11a. The seed rod assembly was fabricated in advance by assembling three sets of square polycrystalline silicon rods so as to take a Π-shape. Moreover, the lateral cross section of the seed rod 11a is a square having one side of about 8 mm, and the entire length of Π-shaped seed rod 11a was set to about 2000 mm. Further, as the seed rod 11a, a seed rod after subjected to surface treatment by mixed liquid of nitric acid and hydrofluoric acid was used.

First, the seed rod 11a was disposed within a reactor 12 to pre-heat the seed rod 11a by means of heater in the reactor, etc. thereafter to perform energization through electrodes 12c, 12c by means of a power supply 13 to heat the seed rod 11a, whereby when the temperature of the seed rod became equal to 1100° C., mixture gas of trichlorosilane (TCS:SiHCl$_3$) and hydrogen was introduced from the supply pipe 14 into the reactor 12 to deposit the polycrystalline silicon deposit 11b on the surface of the seed rod 11a. In this example, in the initial stage of the deposition reaction, a current value caused to flow through the seed rod 11a was temporarily suppressed down to a lower value (e.g. 80 A (1/17.5 of about 1000 A of maximum current value)), thereafter to gradually elevate the current value in correspondence with an increase of the diameter of the polycrystalline silicon deposit 11b to allow current to flow up to 1000 A at the maximum and maintain its current value for a reaction time (about 70 hours). Moreover, in the deposition reaction, the molar ratio of hydrogen to trichlosilane was gradually increased from about 4/1 to about 7/1 at the maximum in correspondence with an increase of the diameter of the polycrystalline silicon deposit 11b. Further, the flow rate of raw material gas was maintained at a predetermined flow rate (10000 lit./min.) in the initial stage of deposition reaction thereafter and gradually the flow rate was elevated to the maximum flow rate (35000 lit./min. which is 3.5 times larger than the initial flow rate). In this way, a polycrystalline silicon rod 11 having a diameter of about 3 inches (77 mm) was provided.

When this polycrystalline silicon rod 11 was observed by the optical microscope with respect to the cross section perpendicular to the axis of the seed rod 11a, lengths and widths of needle-shaped crystals at positions away by 5 mm, 10 mm and 25 mm from the outer circumferential surface of the seed rod 11a toward the outside in the radial direction on the same circumference with the axis of the seed rod 11a being as the center were respectively measured on the basis of observed photographical views of FIG. 2 and FIGS. 4 to 7. As a result, lengths and widths of the needle-shaped crystals at the position (part B) away by 5 mm were respectively 115 µm and 23 µm, lengths and widths of the needle-shaped crystals at the position (part C) away by 10 mm were respectively 225 µm and 55 µm, and lengths and widths of needle-shaped crystals at the position (part D) away by 25 mm were respectively 288 µm and 48 µm. Moreover, the occupied area percentages of needle-shaped crystals in the polycrystalline silicon deposit from the part B cross section to the part D cross section were 78%. Further, lengths and widths of needle-shaped crystals in the seed rod on the part A cross section were respectively 135 µm and 45 µm, and the occupied area percentage of needle-shaped crystals in the seed rod on the part A cross section was 82%. In this example, needle-shaped crystals having ratio of length to the width (aspect ratio) of crystals in the shape of a needle shown in the photographic view is 5 or more were employed as needle-shaped crystals. Further, measuring points of the lengths and the widths of the needle-shaped crystals were set to 5 to 10 points at portions of predetermined sizes, and average value of these points was adopted as measured values of the lengths and the widths of the needle-shaped crystals. Furthermore, the occupied area percentage of needle-shaped crystals was determined by dividing the total area of needle-shaped crystals by the total area of the photographic view. In addition, NIKON ECLIPSE LV150 (eyepiece: ten times, objective: five times) is used as an optical microscope, and measured value limit is 5 µm.

First Comparative Example

A seed rod equivalent to the seed rod described in the example 1 (a seed rod in which the lateral cross section is a square each having one side of about 8 mm, and the entire length is about 2000 mm) was used. Deposition reaction started with the molar ratio of hydrogen to trichlorosilane being set to about 5 and amount of mixture gas of trichlorosilane and hydrogen gradually increased from the initial stage, and the molar ratio gradually increased. The diameter of the polycrystalline silicon rod continued increasing. After the molar ratio becomes equal to 7 to 8, the molar ratio was maintained to be 7 to 8 irrespective of an increase of the diameter of the polycrystalline silicon rod subsequent thereto. Moreover, in the initial stage of the deposition reaction, a current value flowing through the seed rod was set to 85 to 90 A, thereafter the current value gradually was elevated up to about 1300 A in about 70 hours in correspondence with an increase of the diameter of the polycrystalline silicon deposit. Furthermore, the flow rate of raw material gas was maintained at a predetermined flow rate (8000 lit./min.) in the initial stage of the deposition reaction, thereafter the flow rate was gradually increased to allow the maximum flow rate (52000 lit./min which is six and a half times larger than the initial flow rate). Thus, a polycrystalline silicon rod having a diameter of about 3 inches (77 mm) was fabricated. When this polycrystalline silicon rod was observed by the optical microscope with respect to the cross section perpendicular to the axis of the seed rod, lengths and widths of needle-shaped crystals at positions away by 5 mm, 10 mm and 25 mm from the outer circumferential surface of the seed rod toward the outside in the radial direction on the same circumference with the axis of the seed rod being as the center were respectively measured on the basis of photographic views of FIG. 3 and FIGS. 8 to 11. As a result, lengths and widths of the needle-shaped crystals at the position (part B) away by 5 mm were respectively 600 μm and 200 μm, lengths and widths of the needle-shaped crystals at the position (part C) away by 10 mm were respectively 250 μm and 100 μm, and lengths and widths of the needle-shaped crystals at the position (part D) away by 25 mm were respectively 900 μm and 150 μm. Moreover, the occupied area percentages of the needle-shaped crystals in the polycrystalline silicon deposits from the part B cross section to the part D cross section were 58%. Further, lengths and widths of the needle-shaped crystals in the seed rod on the part A cross section were respectively 300 μm and 180 μm, and the occupied area percentage of the needle-shaped crystals in the part A cross section was 53%.

<First Comparative Test and Evaluation>

Polycrystalline silicon rods of the first example and the first comparative example were single-crystallized by the FZ method to fabricate two kinds of single crystal silicon. Whether or not dislocation takes place in these kinds of single crystal silicon was observed. The result thereof is shown in Table 1. In Table 1, sizes of needle-shaped crystals in the polycrystalline silicon rods of the first example and the first comparative example were also described along with presence/absence of dislocation in the single crystal silicon obtained from the polycrystalline silicon rods of the first example and the first comparative example. In addition, whether or not dislocation takes place in the single crystal silicon was visually observed.

TABLE 1

| | Needle-shaped crystal in seed rod | | Needle-shaped crystal in polycrystalline silicon deposit | | | | | | Presence/Absence of dislocation after single-crystallization |
|---|---|---|---|---|---|---|---|---|---|
| | | | Part B | | Part C | | Part D | | |
| | Length (μm) | Width (μm) | Length (μm) | Width (μm) | Length (μm) | Width (μm) | Length (μm) | Width (μm) | by FZ method |
| Example 1 | 135 | 45 | 115 | 23 | 225 | 55 | 288 | 48 | Absence |
| Comparative example 1 | 300 | 180 | 600 | 200 | 250 | 100 | 900 | 150 | Presence |

As apparent from the Table 1, in the first comparative example where there are parts in which lengths of needle-shaped crystals in the polycrystalline silicon deposit are 900 μm, dislocation took place in the single crystal silicon after single-crystallization. On the contrary, in the first example where lengths of the needle-shaped crystals in the polycrystalline silicon deposit is 288 μm or less, no dislocation took place in the single crystal silicon after undergone single-crystallization.

Second Example

Similarly to the first example, polycrystalline silicon 11b was deposited on the outer circumferential surface of the seed rod 11a by using the polycrystalline silicon depositing device 10. The seed rod assembly was fabricated in advance by assembling combined three square polycrystalline silicon rods so as to take a Π-shape. Moreover, the lateral cross section of the seed rod 11a was a square having one side of about 8 mm, and the total length of a Π-shaped seed rod 11a was set about 2000 mm. Further, as the seed rod 11a, seed rod which has been subjected to surface treatment by using a mixed liquid of nitric acid and hydrofluoric acid was used.

First, the seed rod 11a was disposed within a reactor 12 to pre-heat the seed rod 11a by means of heater in the reactor, etc. thereafter energization was performed through electrodes 12c, 12c by means of a power supply 13 to heat the seed rod 11a, whereby when the temperature of the seed rod became above 900° C., mixture gas of trichlorosilane (TCS:SiHCl₃) and hydrogen was introduced into the reactor 12 to deposit polycrystalline silicon deposit 11b on the surface of the seed rod 11a. In the initial stage of the deposition reaction, deposition of the polycrystalline silicon deposit 11b was performed at a current value of 60 to 70 A, thereafter the current value was gradually elevated up to about 150 A until about 20 hours from the start of reaction to perform deposition of the polycrystalline silicon deposit 11b. At this time, temperature at the surface of the polycrystalline silicon deposit 11b was elevated at a ratio of average 1.5° C./hour until 980° C. or less. Next, for a time period until 50 hours have been passed from the time when 20 hours have been passed from the reaction start, the current value was gradually elevated up to about 400 A to deposit the polycrystalline silicon deposit 11b. At this time, temperature of the surface of the polycrystalline silicon deposit 11b was elevated at a ratio of average 1.0° C./hour until 1010° C. or less. Next, for a time period until 100 hours have been passed from the time when 50 hours have been passed from the reaction start, the current value was gradually elevated up to about 1100 A to deposit the polycrystalline silicon deposit 11b. At this time, temperature of the polycrystalline silicon deposit 11b was elevated at a ratio of average 0.8° C./hour until 1050° C. or less. Further, for a time period until 130 hours have been passed from the time when 100 hours have been passed from the reaction start, the current value was gradually elevated up to about 1500 A while gradually lowering the current elevation rate so that the surface temperature of the polycrystalline silicon deposit 11b was not elevated above 1050° C. Thereafter while maintained the surface temperature of the polycrystalline silicon deposit 11b at 1050° C. or less, the current value was gradually elevated up to about 1800 A until the reaction was completed to deposit the polycrystalline silicon deposit 11b. It is to be noted that, in the deposition reaction, the molar ratio between hydrogen and trichlorosilane was gradually increased from about 4/1 in correspondence with an increase of the diameter of the polycrystalline deposit 11b to about 8/1 at the maximum. Further, the flow rate of raw material gas was maintained at a predetermined flow rate (12000 lit./min.) in the initial stage of the deposition reaction, thereafter the flow rate was gradually increased to allow the maximum flow rate (60000 lit./min which is five times larger than the initial flow rate). In this way, a polycrystalline silicon rod 11 having a diameter of more than 5 inches (130 mm) was provided.

Figure 18:
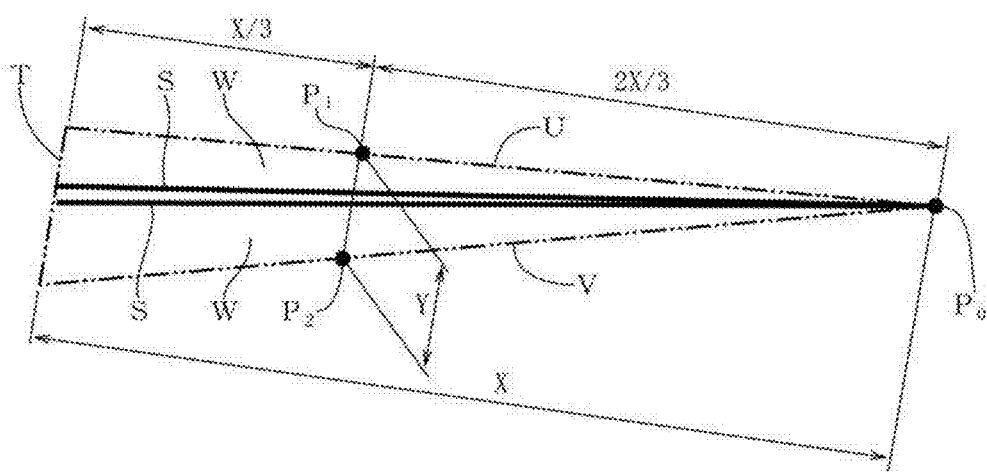
FIG. 18 is a model view of representative needle-shaped crystals shown in the photographic view of the example 2.

When the polycrystalline silicon rod 11 fabricated in the second example was observed by the optical microscope with respect to the cross section perpendicular to the axis of the seed rod 11a, lengths and widths of needle-shaped crystals at positions away by 5 mm, 10 mm, 25 mm and 45 mm from the outer circumferential surface of the seed rod 11a toward the outside in the radial direction on the same circumference with the axis of the seed rod 11a being as the center were respectively measured on the basis of observed photographical views of FIGS. 12 to 17. As a result, lengths and widths of the needle-shaped crystals at the position (part B) away by 5 mm were respectively 226 μm and 30 μm, lengths and widths of the needle-shaped crystals at the position (part C) away by 10 mm were respectively 241 μm and 34 μm, lengths and widths of needle-shaped crystals at the position (part D) away by 25 mm were respectively 271 μm and 45 μm, and lengths and widths of needle-shaped crystals at the position (part E) away by 45 mm were respectively 291 μm and 44 μm. Moreover, the occupied area percentages of needle-shaped crystals in the polycrystalline silicon deposit on the part B cross section to the part E cross section were respectively 22%, 26%, 30% and 17%. Further, lengths and widths of needle-shaped crystals in the seed rod on the part A cross section were respectively 264 μm and 31 μm, and the occupied area percentage of needle-shaped crystals in the seed rod on the part A cross section was 34%. In this example, crystals in the shape of a needle having ratio of length X to the width Y (aspect ratio) of the needle-shaped crystals appearing in the photographic view is 5 or more were adopted as needle-shaped crystals (FIG. 18). For example, as shown in the model view of needle-shaped crystals of FIG. 18, this needle-shaped crystal comprises two straight line parts S (crystal grain boundary), and a substantially triangular-shaped white part W encompassed by double-dotted chain lines U and V (re-crystallized part). Further, the height of the substantially triangular-shaped white part W from the bottom side T is assumed to be length X of the needle-shaped crystal. Moreover, when points that a straight line shifted in parallel by X/3 in a direction of vertex $P_0$ from the bottom side T crosses a pair of side lines U, V of the substantially triangular-shaped white part W are respectively as $P_1$ and $P_2$, the distance between $P_1$ and $P_2$ was assumed as the width Y of the needle-shaped crystal. Moreover, the area of the needle-shaped crystals was calculated on the basis of the length X and the width Y of the needle-shaped crystal, and the occupied area percentage of the needle-shaped crystal was determined by dividing the total area of the needle-shaped crystal by the total area of the photographic view. Further, NIKON ECLIPSE LV 150 (eyepiece: ten times, objective: five time) is used as an optical microscope, and the measurement value limit is 5 μm.

<Second Comparative Test and Evaluation>

Similarly to the first comparative test, the polycrystalline silicon rod of the second example was single-crystallized by the FZ method to fabricate single crystal silicon. Whether or not any dislocation takes place in this single crystal silicon was observed. The result thereof is shown in Table 2. In Table 2, sizes of needle-shaped crystals in the polycrystalline silicon rods of the second example were also described along with presence/absence of dislocation in the single crystal silicon obtained from the polycrystalline silicon rods of the second example. In addition, whether or not dislocation takes place in the single crystal silicon was visually observed.

TABLE 2

| | Needle-shaped crystal in seed rod | | Needle-shaped crystal in polycrystalline silicon deposit | | | | | | | Presence/Absence of dislocation after single-crystallization |
|---|---|---|---|---|---|---|---|---|---|---|
| | | | Part B | | Part C | | Part D | | Part E | |
| | Length (μm) | Width (μm) | Length (μm) | Width (μm) | Length (μm) | Width (μm) | Length (μm) | Width (μm) | Length (μm) | Width (μm) | by FZ method |
| Example 2 | 264 | 31 | 226 | 30 | 241 | 34 | 271 | 45 | 291 | 44 | Absence |

As apparent from the Table 2, in the second example where lengths of the needle-shaped crystals in the polycrystalline silicon deposit is 291 μm or less, no dislocation took place in the single crystal silicon after undergone single-crystallization.

What is claimed is:

1. A polycrystalline silicon rod comprising a seed rod made of polycrystalline silicon, and a polycrystalline silicon deposit which is deposited on an outer circumferential surface of the seed rod by the CVD process,
   wherein a diameter of the polycrystalline silicon rod is 77 mm or less,
   wherein when the polycrystalline silicon rod is observed by an optical microscope with respect to across section perpendicular to an axis of the seed rod, needle-shaped crystals each having a length of 288 μm or less are uniformly distributed radially with the seed rod being as the center in the polycrystalline silicon deposit, and wherein said needle-shaped crystals account for 78% or more area of the cross section.

2. The polycrystalline silicon rod according to claim 1, wherein when the polycrystalline silicon rod is observed with respect to the cross section perpendicular to the axis of the seed rod, lengths and widths of the needle-shaped crystals at a position away by 5 mm from the outer circumferential surface of the seed rod toward the outside in the radial direction thereof on the same circumference with the axis of the seed rod being as the center are distributed so that said lengths and said widths are respectively 115 μm or less and is 23 μm or less.

3. The polycrystalline silicon rod according to claim 1,
wherein when the polycrystalline silicon rod is observed with respect to the cross section perpendicular to the axis of the seed rod, lengths and widths of the needle-shaped crystals at a position away by 10 mm from the outer circumferential surface of the seed rod toward the outside in the radial direction thereof on the same circumference with the axis of the seed rod being as the center are distributed so that said lengths and said widths are respectively 225 μm or less and is 55 μm or less.

4. The polycrystalline silicon rod according to claim 1,
wherein when the polycrystalline silicon rod is observed with respect to the cross section perpendicular to the axis of the seed rod, lengths and widths of the needle-shaped crystals at a position away by 25 mm from the outer circumferential surface of the seed rod toward the outside in the radial direction thereof on the same circumference with the axis of the seed rod being as the center are distributed so that said lengths and said widths are respectively 288 μm or less and is 48 μm or less.

5. The polycrystalline silicon rod according to claim 1,
wherein when the polycrystalline silicon rod is observed with respect to the cross section perpendicular to the axis of the seed rod, lengths and widths of the needle-shaped crystals in the seed rod are distributed so that said lengths and said widths are respectively 135 μm or less and is 45 μm or less.

6. A polycrystalline silicon rod comprising a seed rod made of polycrystalline silicon, and a polycrystalline silicon deposit deposited on an outer circumferential surface of the seed rod by the CVD process, wherein a diameter of the polycrystalline silicon rod is above 77 mm, wherein when the polycrystalline silicon rod is observed by an optical microscope with respect a cross section perpendicular to an axis of the seed rod, needle-shaped crystals each having a length of 291 μm or less are radially and uniformly distributed with the seed rod being as the center in the polycrystalline silicon deposit, and wherein said needle-shaped crystals account for 15% to 35% area of the cross section within a region having a diameter of 127 mm.

7. The polycrystalline silicon rod according to claim 6,
wherein the diameter of the polycrystalline silicon rod is 153 mm or less.

* * * * *